United States Patent
Rousseau

(10) Patent No.: US 8,499,192 B2
(45) Date of Patent: Jul. 30, 2013

(54) TEARING-PROOF METHOD FOR WRITING DATA IN A NONVOLATILE MEMORY

(75) Inventor: Hubert Rousseau, Marseilles (FR)

(73) Assignee: STMicroelectronics (Rousset) SAS, Rousset (FR)

(*) Notice: Subject to any disclaimer, the term of this patent is extended or adjusted under 35 U.S.C. 154(b) by 464 days.

(21) Appl. No.: 12/887,313

(22) Filed: Sep. 21, 2010

(65) Prior Publication Data

US 2011/0072300 A1    Mar. 24, 2011

(30) Foreign Application Priority Data

Sep. 21, 2009  (FR) ..................... 09 04498
Sep. 21, 2009  (FR) ..................... 09 04499
Sep. 21, 2009  (FR) ..................... 09 04500
Sep. 21, 2009  (FR) ..................... 09 04501

(51) Int. Cl.
*G06F 11/00*  (2006.01)

(52) U.S. Cl.
USPC ............ 714/6.1; 714/6.12; 714/15; 714/42; 714/49; 711/103; 711/154

(58) Field of Classification Search
USPC .... 714/6.1, 6.12, 15, 20, 21, 42, 49; 711/103, 711/154
See application file for complete search history.

(56) References Cited

U.S. PATENT DOCUMENTS

| | | | |
|---|---|---|---|
| 6,807,103 B2 | 10/2004 | Cavaleri et al. | 365/185.23 |
| 7,653,836 B1 * | 1/2010 | Chatterjee et al. | 714/20 |
| 7,818,610 B2 * | 10/2010 | Rogers et al. | 714/6.12 |
| 8,060,806 B2 | 11/2011 | Shalvi et al. | |
| 8,085,586 B2 | 12/2011 | Golov et al. | |
| 8,156,398 B2 | 4/2012 | Sommer | |
| 8,225,181 B2 | 7/2012 | Perlmutter et al. | |
| 8,261,159 B1 | 9/2012 | Sommer et al. | |
| 2005/0144357 A1 | 6/2005 | Sinclair | 711/103 |
| 2005/0144362 A1 | 6/2005 | Lin et al. | 711/103 |
| 2005/0201177 A1 | 9/2005 | Shiraishi et al. | 365/222 |
| 2005/0216653 A1 | 9/2005 | Aasheim et al. | 711/103 |
| 2005/0231643 A1 | 10/2005 | Ross et al. | 348/578 |
| 2005/0251643 A1 | 11/2005 | Dirscherl et al. | 711/206 |
| 2007/0101095 A1 | 5/2007 | Gorobets | |
| 2007/0124531 A1 | 5/2007 | Nishihara | 711/3 |
| 2008/0082736 A1 | 4/2008 | Chow et al. | 711/103 |
| 2008/0301357 A1 | 12/2008 | La Rosa et al. | 711/103 |
| 2009/0150599 A1 | 6/2009 | Bennett | 711/103 |
| 2009/0172262 A1 * | 7/2009 | Olbrich et al. | 711/103 |
| 2009/0172466 A1 * | 7/2009 | Royer et al. | 714/6 |
| 2009/0198902 A1 | 8/2009 | Khmelnitsky et al. | 711/135 |
| 2010/0088467 A1 | 4/2010 | Lee et al. | |
| 2010/0235565 A1 * | 9/2010 | Ton-That et al. | 711/103 |
| 2011/0093650 A1 * | 4/2011 | Kwon et al. | 711/103 |
| 2012/0005412 A1 | 1/2012 | Ware | |

FOREIGN PATENT DOCUMENTS

| | | |
|---|---|---|
| WO | 2007/081598 | 7/2007 |
| WO | 2008/019218 | 2/2008 |
| WO | 2009/067476 | 5/2009 |

* cited by examiner

Primary Examiner — Joseph D Manoskey
(74) Attorney, Agent, or Firm — Seed IP Law Group PLLC

(57) ABSTRACT

A method for writing and reading data in memory cells, comprising, when writing a data in a block of a first memory zone, a step consisting of writing in a second memory zone a temporary information structure metadata comprising a start flag, an identifier of the temporary information structure, an information about the location of the block in the first memory zone, and a final flag, and, after a power on of the first memory zone, searching for an anomaly in temporary information structures present in the second memory zone.

24 Claims, 8 Drawing Sheets

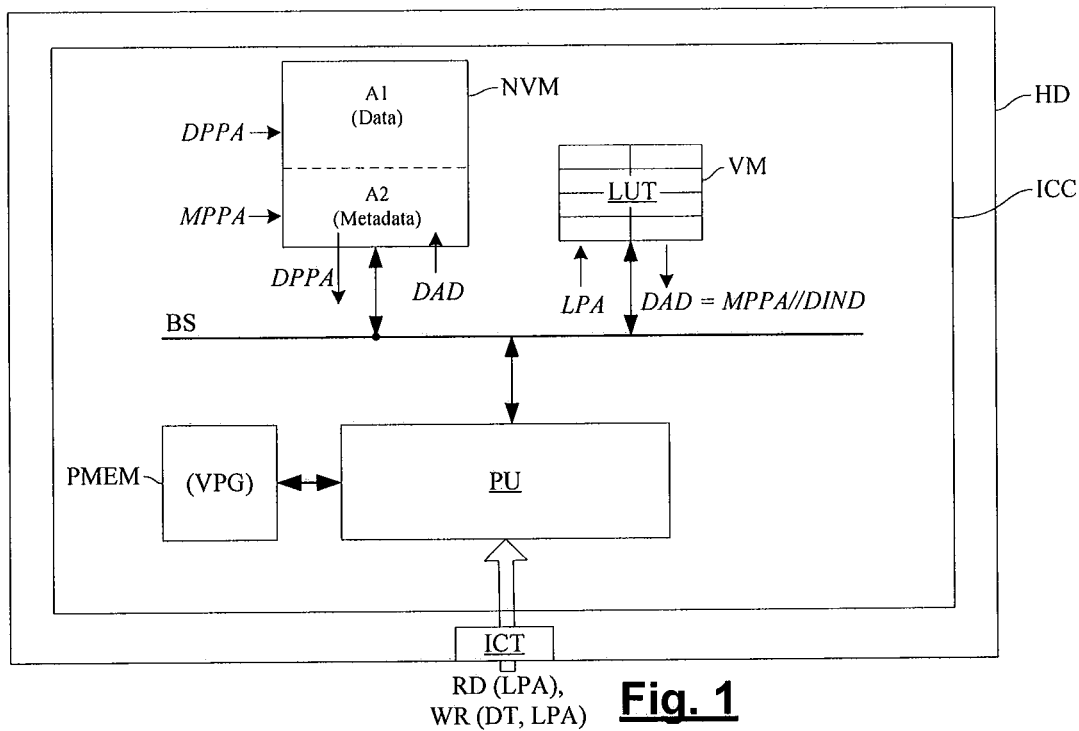

TEARING-PROOF METHOD FOR WRITING DATA IN A NONVOLATILE MEMORY

BACKGROUND

1. Technical Field

The present disclosure relates to nonvolatile memories and particularly electrically programmable and erasable memories of the FLASH type.

2. Description of the Related Art

The market for electrically programmable and erasable memories on semiconductor wafers is traditionally divided between EEPROM memories and FLASH memories (or FLASH-EEPROM).

EEPROM memories comprise memory cells consisting of one floating gate transistor and one access transistor. FLASH-type memories comprise only one floating gate transistor per memory cell, and have the advantage being highly compact as far as the semiconductor surface occupied is concerned (the number of memory cells per surface unit). On the other hand, the absence of an access transistor involves the provision of positive threshold voltages for both the erased memory cells and the programmed memory cells so as to not create short circuits upon the bit lines. The gate oxides are therefore thick in order to durably maintain the electrical charges trapped in the floating gates, which entails a longer erase time. The erasure of FLASH memory cells is often done by tunnel effect whereas their programming is done by hot electron injection. The time for writing the memory cells is short, for example 5 microseconds, whereas the erase time is long, for example 100 milliseconds. Moreover, hot electron injection programming involves a high programming current, such that the number of memory cells able to be simultaneously programmed is generally limited to one byte.

FLASH memories were thus originally dedicated to mass storage. Various improvements have since been proposed so that they may offer features closer to those of EEPROM memories. Among the improvements that may be cited is a page-erasable FLASH memory, such as that described by U.S. Pat. No. 6,807,103, which is incorporated herein by reference in its entirety.

These improvements have allowed for the commercialization of page-erasable FLASH memories offering the same apparent functionalities as those of EEPROM memories, but in which certain limitations remain:

a long erase time, which may be cumbersome in certain applications. Indeed, the apparent write time of a byte is determined by the erase time of the page that will receive the byte, the page to be completely erased each time a new byte is to be written within, the other bytes initially present in the page also to be written within; and a lack of protection against untimely power interruptions during the erasure of a page or the writing of blocks.

As a result, FLASH memories were initially unable to be used as embedded memories in integrated circuits destined for applications where there is a high risk of a power supply interruption, mainly applications for chip cards or electronic tags, in which the power supplied to the integrated circuit may disappear in the case of a "tearing" (removal of the card from the card reader).

Other improvements to FLASH memories thus aimed to improve the data write time and to protect the data from tearing. To this end, data write methods called "delayed erase" were proposed. According to these methods, the writing of data is done in erased pages and comprises memory cell write cycles without associated erase cycles. The successive writing of data in erased pages reveals invalid data, filling up more memory space than that which is necessary to store the valid data. As the memory space diminishes, the invalid data are erased to free up memory space (delayed erase). It has generally been proposed to use the write methods with delayed erase in relation with the protection of data against tearing ("tearing proof programming" or "anti-tearing methods"), because the applications requiring a fast data write are generally applications that are sensitive to power supply problems (chip cards).

As an example, the patent application publication No. US2005/0251643 describes a method of writing data protected against tearing ("tearing proof programming", Cf. paragraph 0008) adapted to FLASH memories. The memory pages are used to store, in addition to the useful data, a logical page address and a counter value. A look-up table allows a logical address to be associated with a physical address (electric address). When a data is to be written in a page, the page contents are copied into a page buffer. The new data is incorporated therein, and the counter value is incremented. The updated page contents are then written into another page, with the same logical address. The initial page is then erased.

U.S. Patent Application Publication No. US2008/0301357, which is incorporated herein by reference in its entirety, describes a method of writing data with delayed erase, in which the page erasure is done in "N" steps of partial erasure of short duration, which are applied to pages other than those used to write the data. A step of partial erasure is launched after each step of writing of data, such that after N steps of writing, erased pages are obtained. Then a rotation is performed between the erased pages and the pages containing invalid data, the erased pages being used to write new data while the invalid pages are then submitted to the progressive erasure process. To this end, an auxiliary memory zone comprises a "current" sector comprising erased auxiliary pages usable to write the data, a "save" sector comprising auxiliary pages containing data linked to pages to erase or being erased, a "transfer" sector comprising pages containing data to transfer into the erased pages, and an "unavailable" sector comprising pages being erased.

In summary, the above methods of delayed erase may handle entire pages. The pages of data are written in pre-erased material pages, the addresses of which are arbitrary, and a page logical address or "tag" that allows the page to be found is attributed to each page of data. This "tag" is saved with the page data and is "attached" to them, that is to say concatenated and placed in the same physical page. Another feature of the above methods is that each writing of a data in response to a write command involves the reading of all the page data, the insertion of the new data into the page data, then the rewriting of all the updated page data. As a result, a large "consumption" of erased pages occurs, in other words a high "cycling" and therefore an accelerated memory cell wear (the "cycling" representing the number of times that a page has been erased).

BRIEF SUMMARY

The present disclosure proposes improvements to methods of writing with delayed erase.

More particularly, embodiments of the disclosure relate to a method for writing and reading data in electrically erasable and programmable nonvolatile memory cells, comprising the steps consisting of: providing a first nonvolatile memory zone programmable by block; writing data in erased blocks of the first memory zone; providing a second nonvolatile memory zone containing metadata associated with data in the first memory zone; and when writing a data in a block of the first memory zone, writing in the second memory zone a temporary information structure metadata associated with the writing of the data and comprising: a start flag, an identifier of the temporary information structure, an information about the location of the block in the first memory zone, and a final flag; and after a power on of the first memory zone, searching for an anomaly in temporary information structures present in the second memory zone.

According to one embodiment, an anomaly is detected in a temporary information structure when flags of the temporary information structure do not have the same logic state, erased or written.

According to one embodiment, the method comprises, upon the detection of an anomaly in a temporary information structure: a step consisting of recopying the erroneous temporary information structure into the second memory zone, then a step consisting of neutralizing the erroneous temporary information structure, comprising the writing of erased metadata and the overwriting of programmed metadata of the structure.

According to one embodiment, the method comprises, when writing a data in a block of the first memory zone, the steps consisting of: writing a first part of the start flag; then, in a fixed or indifferent order, writing the identifier of the temporary information structure and the information about the location of the block in the first memory zone; then writing a second part of the start flag; then writing the data in the block of the first memory zone; then writing the final flag.

According to one embodiment, the method comprises the steps consisting of: defining erasable pages in the first memory zone, a page comprising several blocks; and during the erasure of a page of the first memory zone, writing in the second memory zone a metadata temporary information structure associated with the erasure of the page and comprising: a start flag; an identifier of the temporary information structure; an information about the location of the page to be erased in the first memory zone; and a final flag.

According to one embodiment, the method comprises the steps consisting of: writing a first part of the start flag; then, in a fixed or indifferent order, writing the identifier of the temporary information structure, the information about the location of the page to be erased in the first memory zone; then writing a second part of the start flag; then erasing the page; then writing the final flag.

According to one embodiment, the method comprises the steps consisting of: defining a virtual memory comprising logical pages having a logical address; defining, in the logical pages, logical blocks having a logical address; defining write commands and read commands of data in the logical blocks; defining, in the first memory zone, erasable physical pages having a physical address; defining, in the erasable physical pages, programmable physical blocks of the same size as the logical blocks and having a physical address; and defining, in the second memory zone, metadata structures associated with the physical blocks, comprising information about the status of each physical block from among the following statuses: block erased, block containing a valid data, or block containing an invalid data.

According to one embodiment, the method comprises a step consisting of providing metadata structures forming descriptors, a descriptor being associated with a physical page and comprising: a first field containing the address of the physical page in the first memory zone or a physical address index; a second field containing the logical address of a logical page in the virtual memory or logical address index; and for each physical block of the physical page with which the descriptor is associated, a third field containing: an information about the location of the physical block in the physical page, an information about the status of the physical block from the at least three following statuses: block erased, block containing a valid data, or block containing an invalid data, and an information about the location, in the logical page, of the logical block of which the data is stored in the physical block.

According to one embodiment, the writing, in the temporary information structure, of the information about the location of the block to write comprises the writing of an information about the location in the second memory zone of the metadata structure associated with the block to program.

According to one embodiment, the method comprises, in response to a read command of a data including a logical address, the steps consisting of: finding in the second memory zone a descriptor containing the logical address and associated with valid data; reading in the descriptor an address of the data in the first memory zone; and reading the data in the first memory zone.

According to one embodiment, the method comprises a step of erasing one page of the second memory zone only containing invalid metadata, and, during the erasure of the metadata page, steps consisting of writing in the second memory zone a temporary information structure associated with the erasure of the metadata page and comprising: a start flag, an identifier of the temporary information structure, an information about the location of the page to be erased in the second memory zone, and a final flag.

According to one embodiment, the method further comprises a step consisting of writing, in the temporary information structure associated with the erasure of the metadata page, the value of a wear counter associated with the metadata page, representative of a number of erase cycles that the metadata page has undergone.

According to one embodiment, the method comprises, after the detection of an anomaly in a temporary information structure, an action aiming to correct the effects of the cause of the anomaly and to put the first or the second memory zone back into the state that it was in before the cause of the anomaly occurred.

According to one embodiment, the method comprises a step consisting of defining the first and second memory zones within a same nonvolatile memory.

Embodiments of the disclosure relate to an integrated circuit comprising a processing unit, at least one nonvolatile memory comprising electrically erasable and programmable memory cells, and the processing unit is configured to write and read data in the nonvolatile memory in conformance with the method described above.

Embodiments of the disclosure relate to a portable object comprising such an integrated circuit.

BRIEF DESCRIPTION OF THE SEVERAL VIEWS OF THE DRAWINGS

Embodiments of systems and methods for writing and reading data will be described in the following with reference to, in a non-limiting manner, the attached drawings in which:

FIG. 1 shows a device equipped with a nonvolatile memory and comprising means for implementing an embodiment of the method, FIG. 2 shows schematically an arrangement of data and of metadata in the memory of the integrated circuit.

DETAILED DESCRIPTION

Figure 4A:
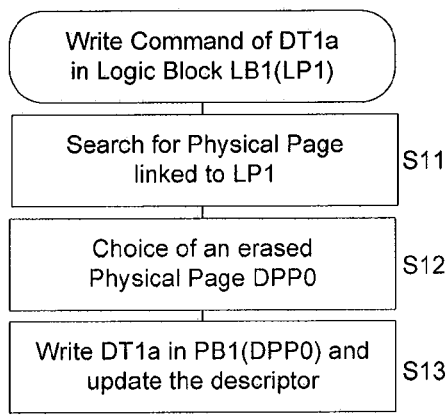
FIGS. 4A to 4E are flowcharts describing example steps of data writing in the memory of the integrated circuit.

The disclosure relates to various improvements to methods of data writing with delayed erase, particularly applicable to FLASH memories. The disclosure has several aspects that will be described in distinct sections in the following description. It may be noted that the disclosure is not limited to a combination of these aspects, but rather relates to each aspect as it may be considered independently of the other aspects. Therefore, in the following, phrases such as "according to the disclosure" or "according to an aspect of the disclosure" may relate to embodiments of the disclosure implementing only one of these aspects, some of these aspects, or all of these aspects at the same time, and do not signify that all the embodiments of the disclosure comprise the described feature.

It will be considered in the following, by convention, that the logic "1" represents the value of a data present in an erased memory cell, or "erased logic value". Consequently, the logic "0" represents the value of a data present in a programmed memory cell, or "programmed logic value". Furthermore, the data are shown in hexadecimal notation, the value of an erased byte therefore being "FF" according to this notation.

I—Example of a Device Implementing the Method

FIG. 1 shows an example of a device comprising means for implementing the method for writing and reading data. The device is in the form of a integrated circuit ICC on a semiconductor wafer comprising a nonvolatile memory NVM, a volatile memory VM, a processing unit PU, and a communication interface ICT. The memories NVM and VM are linked to the processing unit PU by means of a data and address bus BS, and of a control bus (not shown). The memory NVM is a byte-programmable and page-erasable memory, for example a FLASH memory comprising pages of 256 bytes.

The processing unit PU, for example a microprocessor or a microcontroller, is equipped with a program memory PMEM in which is stored a "virtualization" program VPG of the memory NVM, configured to execute an example method of the disclosure. Alternatively, the processing unit PU may be a hard-wired sequencer (state machine or a microprogrammed control unit) configured to execute example methods of the disclosure without the intervention of a program stored in a programmed memory. Therefore, phrases such as "the executed program", "the program is configured to", "the program manages", "the program performs" that may be used in the following do not signify that the methods described herein are exclusively implemented in the form of a program implemented by a microprocessor.

In the embodiment example shown in FIG. 1, the integrated circuit ICC is mounted on or embedded in a portable support HD ("Handheld Device"), for example a card made of a plastic material. The circuit ICC comprises interface communication means ICT of contact or contactless type, for example ISO 7816 contacts or a communication interface by inductive coupling ISO 14443 or ISO 15693. The integrated circuit receives, by means of the interface ICT, commands WR(LBA, DT) for data writing in the memory NVM and commands RD(LBA) for data reading in the memory NVM. Each command comprises a command code and a logical address LBA of the data to read or to write. A write command also comprises a data DT to write in the memory.

The virtualization program VPG manages the contents of the memory NVM and ensures the execution of write and read commands in such a manner that, seen from the exterior, the memory NVM is seen as a virtual block-programmable memory, in which a block of data may be indefinitely programmed without worrying about its erasure. The logical addresses LBA supplied with the commands thus form addresses designating blocks of the virtual memory. Such addresses are called "logical addresses" and the blocks that they designate are "logical blocks".

On the interior of the memory NVM, the program VPG ensures the data writing according to a method of writing with delayed erase. As an example, a step of writing with delayed erase of the following byte:

"01010101"

comprises writing this data in an erased byte of which all the bits are at 1:

11111111, and only involves the programming of the first, third, fifth, and seventh bits of the byte in order to set them at 0.

Thus, in response to a data write command, the program VPG need only write the data in erased memory cells, and more precisely need only program the memory cells that are to contain a bit equal to 0. This "writing" reduced to a programming of memory cells is done without erasing previous data having the same logical address, which may have already been programmed in the physical memory. These previous data are invalidated by the program VPG but are not erased.

The program VPG ensures the later erasure of the invalid data during the execution of memory maintenance tasks, to obtain new erased memory cells ready to receive data.

Besides tasks of erasing invalid data, the program VPG may conduct maintenance tasks consisting of regrouping the valid data that are dispersed in the memory array in order to reveal groups of invalid data that will then be erased in order to free up memory space.

Now will be described in further detail various aspects of example methods for writing and reading data, implemented by means of the program VPG.

II—First Aspect: Provision of a Metadata Zone

In the prior art, the programming of data blocks in pages erased beforehand includes each data being written in a block of which the physical address is different than the logical address. The data of the type "block" is "labeled" in a manner similar to the labeling of pages in the methods described by U.S. Patent Application Publication No. US2008/0301357 or U.S. Patent Application Publication No. US2005/0251643, which are both herein incorporated by reference in their entirety. The label is for example the logical address of the data and is concatenated with the data. Such a labeling method applied to data blocks rather than to data pages entails a prohibitive multiplication of the number of labels and a complication of the labels (the address of a block being longer than the address of a page), leading to a memory space congestion problem due to the labeling data.

The disclosure proposes an advantageous solution allowing for the identification of data in a memory space, without having to resort to the conventional labeling technique, by providing management data arranged in a dedicated memory space and allowing for the memory management by reference to a virtual memory structure.

FIG. 2 shows schematically such a virtual memory structure, that is to say the memory as seen from the exterior thanks to the program VPG. FIG. 2 also shows the physical memory space organization inside the memory NVM.

The virtual memory comprises K+1 logical pages LP (LP0, LP1 ... LPK) designated by the logical addresses LPA (00, 01 ... K). The logical pages LP are here of the same size as the material pages of the memory zone A1 of the memory NVM, here 256 bytes, and are divided into individually addressable logical blocks LB and are designated by the addresses LBA present in the commands WR and RD. The address LBA of a logical block is formed by the address LPA of the logical page in which the block is found and by the index of the block in the page, that is to say its rank in the page.

In an embodiment, the number of blocks per logical page is an initialization parameter of the program VPG, the choice of which is left up to the discretion of the user. It will be supposed in the following and throughout the entire description, in a non-limiting manner, that the logical pages are divided into four logical blocks LB (LB1, LB2, LB3, LB4) of 64 bytes each.

The physical memory space is divided into a memory zone A1 provided to store application data received by write commands WR, and a memory zone A2 provided to receive the previously-cited management data, which is provided to manage the data present in the first memory zone. Such management data will be called "metadata" in order to distinguish them from the application data and therefore consist of data concerning the application data.

The memory zone A1 comprises N+1 data physical pages DPP (DPP0, DPP1, ... DPPN) designated by physical addresses DPPA (00, 01, ... N). The physical pages are preferably of the same size as the logical pages and are therefore here of the same size as the material pages of the memory. They each comprise the same number of physical blocks as a logical page, that is four physical blocks PB (PB1, PB2, PB3, PB4) of 64 bytes each.

The notion of "physical block" represents, for the virtualization program VPG, the smallest part of the physical memory that may be written in response to a logical block write command, and is independent of the memory NVM material architecture, here a byte-programmable memory, for which the smallest programmable data is therefore a byte. In addition, a "physical page" represents here, for the virtualization program VPG, the smallest erasable part of the physical memory area, that is the material page of the memory NVM.

At the physical interface level of the memory, the writing of a physical block of 64 bytes may result in the application of 64 byte programming instructions to the memory. The low level interface part of the program VPG will not be described in detail here. The program VPG may for example call a "block write" sub-program comprising 64 iterations of a byte programming loop. During the block programming, the data to write are placed in a buffer and the sub-program is called by the program VPG. Similarly, the program VPG may call a "block read" sub-program comprising 64 iterations of a byte read loop. Alternatively, the processing unit PU is configured to read the memory NVM by words of 32 or 64 bits.

Still in reference to FIG. 2, the memory zone A2 comprises metadata physical pages MPP designated by their physical address MPPA. Contrary to the memory zone A1, the program VPG manages the memory zone A2 without a notion of "block", and programs the metadata by exploiting the natural granularity offered by the memory, here a granularity of a byte for writing and for reading, and a granularity of a page for erasing.

On the other hand, the program VPG implements the data write method with delayed erase both in the memory zone A1 and in the memory zone A2. Thus, maintenance tasks are equally provided in the memory zone A2 so as to free up memory space for the metadata by erasure of pages containing invalid metadata.

In this example, the memory zones A1, A2 being two sectors of the memory NVM, the top and bottom limits of memory zones A1, A2 may be defined by the program VPG as a function of parameters such as the physical memory size and the size of logical blocks within virtual memory pages. The program VPG determines an optimum repartition between the memory space attributed to data and the memory space attributed to metadata, and thus determines the limits of each memory zone. The physical memory zone A1 is necessarily larger than the virtual memory zone due to the invalid data generated by the delayed-erase write method. For example, if the memory NVM comprises 1024 pages and if the logical block size is 64 bytes (that is 4 blocks per logical page), the program may attribute 896 pages to the zone A1 (that is 224 kB of data) and 128 pages to the zone A2 (that is 32 kB of metadata), and define a virtual memory of 218 kB representing 85.2% of the memory space offered by the physical memory.

In other embodiments, the memory zone A2 may be located in a dedicated nonvolatile memory, distinct from the memory NVM. In this case, the memory zone A2 may comprise physical pages having a size different than that of physical pages of the memory NVM. Generally, the method described herein does not impose a structural relation between the physical pages of metadata and the physical pages of data, and involves metadata that are read- and write-accessible with a sufficient granularity so as to not slow down the program execution.

Metadata Structure Example

The correspondence between the physical addresses of physical blocks PB of data and the logical addresses of logical blocks, is ensured by means of a metadata structure configured in the memory zone A2 by the program VPG. In an embodiment, this metadata structure comprises compact elements associated with physical pages of the memory zone A1, called "descriptors" DSC0, DSC, ... DSCN. The descriptors ensure the link between the logical pages and the physical pages as well as the link between the physical blocks and the logical blocks. They also comprise information about the status, valid or invalid, of the data present in the physical blocks.

Each descriptor comprises for example the following fields:
  a physical address field DPPA,
  a field WC,
  a logical address field LPA, and
  a Data Status field DS for each physical block PB1, PB2, PB3, PB4 of the physical page with which the descriptor is associated, that is here four fields DS in total: DS(PB1), DS(PB2), DS(PB3), DS(PB4).

The physical address field DPPA receives the address DPPA of the physical page with which the descriptor is associated, preferably in the form of an index indicating the position of the physical page in the memory zone A1 relative to the first address of the memory zone A1. Similarly, the logical address field LPA receives the logical address LPA of a virtual memory page, preferably in the form of an index indicating the position of the logical page in the virtual memory.

The field WC is reserved for a usage that will be described later but is also used to invalidate a descriptor. The invalidation value of the descriptor is obtained by programming all the bits of the field WC, that is "000000" in hexadecimal notation.

The fields DS are indexed fields describing the status of the data in the blocks of the physical page with which the descriptor is associated. More particularly, the rank of each field DS in the descriptor corresponds to the rank, in the physical page with which the descriptor is associated, of the physical block with which the field DS is associated. Thus, the field DS(PB1) appears in the first position in the descriptor and is associated with the first block PB1 of the physical page with which the descriptor is associated. The field DS(PB2) appears in the second position in the descriptor and is associated with the second block PB2 of this physical page, etc., the number of fields DS in a descriptor being a function of the number of blocks per physical page.

The contents of each field DS contain an information that is coded in the following manner:
- an erased field DS (only containing 1's) signifies that the corresponding physical block PB is erased,
- a programmed field DS (only containing 0's) signifies that the corresponding physical block PB contains an invalid data,
- a partially programmed field DS and containing a value "I" between 1 and 4 signifies that the corresponding physical block PB contains the data of the logical block of the index "I" in the logical page, the address LPA of which appears in the descriptor.

In an embodiment, the size of descriptor fields is for example the following:
DPPA: 2 bytes, with a useful value between 0 and FFFE, the value FFFF being reserved for the identification of a free descriptor (i.e., in the erased state),
WC: 3 bytes,
LPA: 2 bytes, with a useful value between 0 and FFFE, the value FFFF being reserved for the identification of a free physical page (i.e., that is not yet associated with a logical address),
DS: 1 byte plus 1 redundant byte of the same value.

The size of a descriptor is in this case 15 bytes, and a physical page of 256 bytes of the memory zone A2 may receive 16 descriptors, with 16 remaining bytes available to code a page header in a manner that will be described later.

During the first utilization of the memory, the program NVM configures the descriptors in a manner such that each physical page of the memory zone A1 is associated with a descriptor. The field WC, described later, is equally configured during the first utilization of the memory. At this stage, as no data have been written in the memory zone A1, the descriptors are not associated with any logical page and the field LPA is left in the erased state. Similarly, the fields DS are left in the erased state.

FIG. 2 is an "image" of memory zones A1 and A2 and of the virtual memory at a given moment. The data and the metadata shown therein, given by way of example, are coded in hexadecimal format and are reduced to a byte to simplify the drawing. Thus, in the drawing, a data or a metadata may have values between 00 (data or metadata of which all the bits are programmed) to FF (data or metadata completely erased), the intermediary values being composed of programmed bits (0) and erased bits (1).

The virtual memory being an "ideal" memory, it only comprises valid data. Found therein are data DT1c, DT2, and DT3 saved respectively in the logical blocks LB1, LB4 and LB2 of the logical page LP1 of address 01. All the other logical blocks are equal to FF, which signifies that they have not received data.

Valid data DT1c, DT2 and DT3 are found in the memory zone A1. The data DT2 is saved in the block PB3 of the page DPP0 of address 00, and the data DT3 is saved in the block PB4 of this page. The data DT1c is saved in the block PB1 of the physical page DPP2 of address 02. Also found in the memory zone A1 are invalid data DT1a, DT1b saved in the blocks PB1 and PB2 of the physical page DPP0.

The link between the location of the data in the physical memory A1 and their location in the virtual memory is ensured by the descriptors, by means of the fields described above. The descriptors also indicate the data status (valid or invalid).

Thus, the memory zone A2 contains a descriptor DSC0 associated with the page DPP0 in which:
- the field DPPA contains the address "00", which signifies that the descriptor is associated with the page DPP0,
- the field LPA contains the address "01" and designates the logical page LP1 of the virtual memory, which signifies that the data of the logical page LP1 are stored in the physical page DPP0,
- the field DS(PB1) is equal to 00, which signifies that the physical block PB1 of the page DPP0 contains an invalid data,
- the field DS(PB2) is equal to 00, which signifies that the physical block PB2 of the page DPP0 contains an invalid data,
- the field DS(PB3) is equal to 04, which signifies that the physical block PB3 of the page DPP0 contains a valid data located in the fourth logical block LB4 of the logical page LP1 (that is DT2),
- the field DS(PB4) is equal to 02, which signifies that the physical block PB4 of the page DPP0 contains a valid data located in the second logical block LB4 of the logical page LP1 (that is DT3).

The memory zone A2 also contains a descriptor DSC2 associated with the page DPP2 in which:
- the field DPPA contains the address "02", which signifies that the descriptor is associated with the page DPP2,
- the field LPA contains the address "01" and designates the logical page LP1 of the virtual memory, which signifies that the data of the logical page LP1 also were saved in the physical page DPP2,
- the field DS(PB1) is equal to 01, which signifies that the physical block PB1 of the page DPP2 contains a valid data located in the first block LB1 of the logical page LP1 (that is DT1c),
- the fields DS(PB2), DS(PB3), and DS(PB4) are equal to FF, which signifies that the physical blocks PB2, PB3, PB4 of the page DPP2 do not contain data.

The memory zone A2 also comprises the other descriptors DSC2 ... DSCN of other physical pages of which the field DPPA comprises the address of the associated page, and of which the fields LPA, DS(PB1), DS(PB2), DS(PB3), DS(PB4) are erased (equal to FF), signifying that all the other pages of the memory zone A2 do not contain data.

The ensemble of the descriptors thus forms the equivalent of a compact database that allows, at each moment, to know to which logical block each data in each physical block belongs, and to know whether the data is valid or invalid.

The metadata structure having been described, aspects relative to the dynamic utilization of the descriptors and to their configuration during memory write operations will now be described.

Data Write Sequence Example

Figure 3:
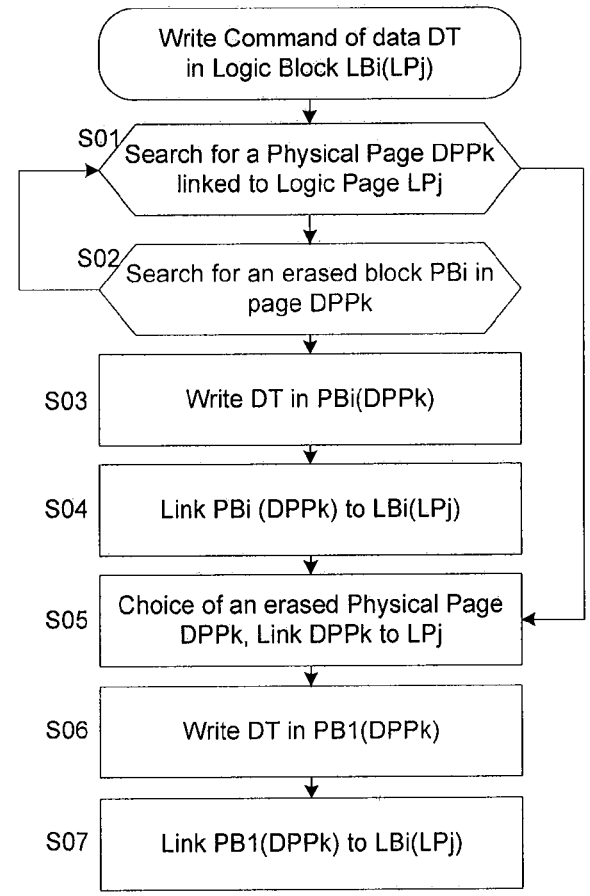
FIG. 3 is a flowchart describing a data write operation in the memory of the integrated circuit.

FIG. 3 is a flowchart describing, in a simplified manner, the execution of a data write operation in a logical block LBi(LPj) of a logical page LPj. During a step S01, the program VPG searches for a physical page DPPk linked to the logical page LPj by scanning the descriptor fields LPA. When the page DPPk is found, the program VPG searches for an erased physical block PBi in the page DPPk by scanning the descriptor fields DS until it finds a field DS equal to FF, indicating that the block is erased. The rank of the field DS in the descriptor allows the program VPG to deduce the physical block index in the page DPPk, the address of which appears in the field DPPA, and thus allows it to reconstruct the block address by adding the index to the address DPPA. During a step S03, the program VPG writes the data DT in the physical block PBi of the page DPPk. During a step S04, the program VPG links the physical block PBi of the page DPPk to the logical block LBi of the logical page LPj by writing, in the descriptor field DS relating to the block PBi, the index of the logical block LBi in the page LPj. In a virtual memory structure of 4 blocks per page, this index corresponds to two insignificant address bits of the logical block LBi such as supplied with the write command.

It may happen that at the step S02 the program VPG does not find an erased field DS, which signifies that the physical page does not comprise an available block for writing the data. In this case, the program VPG returns to the step S01 to search in the descriptors for a new physical page linked to the logical page LPj.

It may also happen that at the step S01 the program VPG does not find a physical page DPPk linked to logical page LPj. In this case, the program VPG goes to a step S05 where it chooses a descriptor associated with a valid physical page DPPk that is not linked to any logical page (erased field LPA) and is therefore in the erased state. The program VPG links the physical page to the logical page LPj by programming the logical page address in the field LPA of its descriptor. Then, during a step S06, the program VPG writes the data DT in the first physical block PB1 of the page DPPk. During a step S07, the program VPG links the physical block PB1 to the logical block LBi by writing the logical block index in the first descriptor field DS.

The flowcharts shown in the FIGS. 4A, 4B, 4C, 4D, and 4E describe in a simplified manner the writing of data DT1$a$, DT1$b$, DT1$c$, DT2, DT3 leading to the physical memory configuration as shown in FIG. 2. The FIGS. 5A, 5B, 5C, 5D and 5E show these steps and show how the configuration of the memory zones A1 and A2 evolves step by step during the data writing until the configuration of FIG. 5E is obtained, which is identical to that of FIG. 2.

Figure 5A:
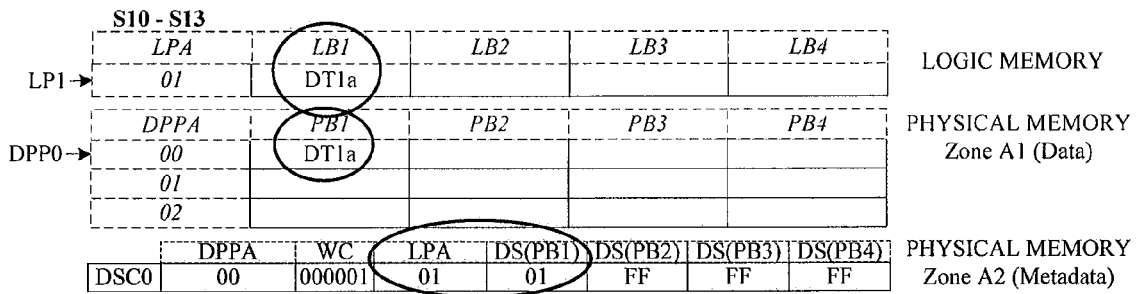
FIGS. 5A to 5E show data writing described by the FIGS. 4A to 4E.

The flowchart of FIG. 4A describes the execution steps of a write command of a data DT1$a$ in the logical block LB1 (LP1) (first logical block of the logical page LP1). During a step S11, the program VPG searches in the descriptors for a physical page linked to LP1 and does not find one (in this example, the memory is supposed to be entirely blank). During a step S12, the program VPG chooses the erased physical page DPP0 and updates the descriptor DSC0 of this page by writing the value 01 in the field LPA so as to link it to the logical page LP1. During a step S13, the program VPG writes the data DT1$a$ in the block PB1(DPP0), Cf. FIG. 5A, and updates the descriptor DSC0 by writing in the field DS(PB1) the value 01 representing the index of the logical block LB1 (LP1)).

Figure 4B:
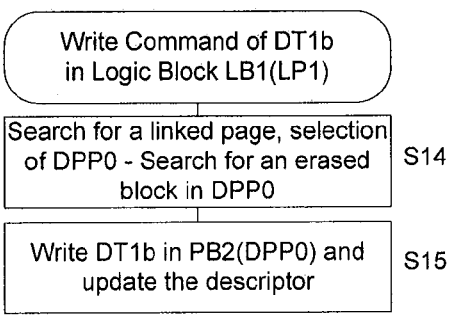
Figure 5B:
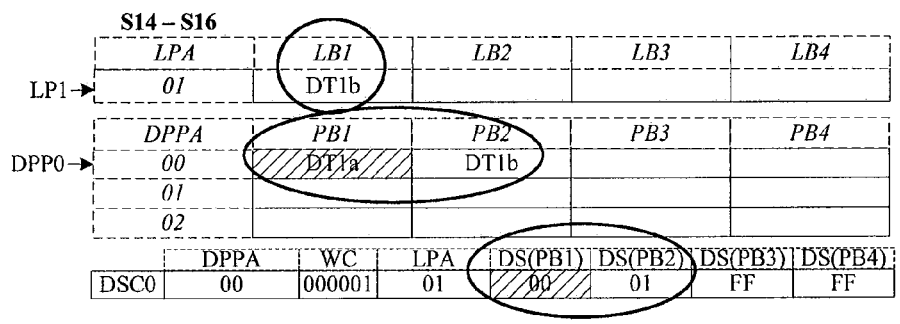

The flowchart of FIG. 4B describes the execution steps of a write command of the data DT1$b$ in the same logical block LB1(LP1). During a step S14, the program VPG searches in the descriptors for a physical page linked to the logical page LP1, finds the page DPP0, then searches in its descriptor for an erased physical block and finds the erased field DS(PB2). During a step S15, the program VPG writes the data DT1$b$ in the physical block PB2(DPP0), writes all the bits of the descriptor field DS(PB1) to invalidate the data DT1$a$ present in the block PB1, and writes the value 01 in the field DS(PB2), Cf. FIG. 5B, which signifies that the valid data DT1$b$ of the logical block LB1(LP1) is now found in the physical block PB2(DPP0).

Figure 4C:
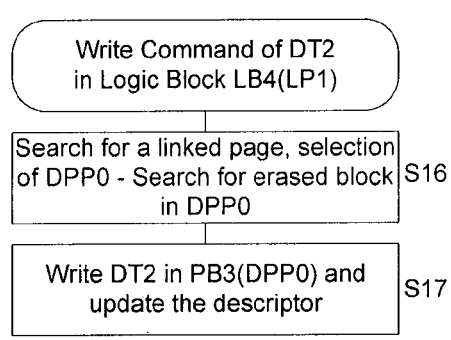
Figure 5C:
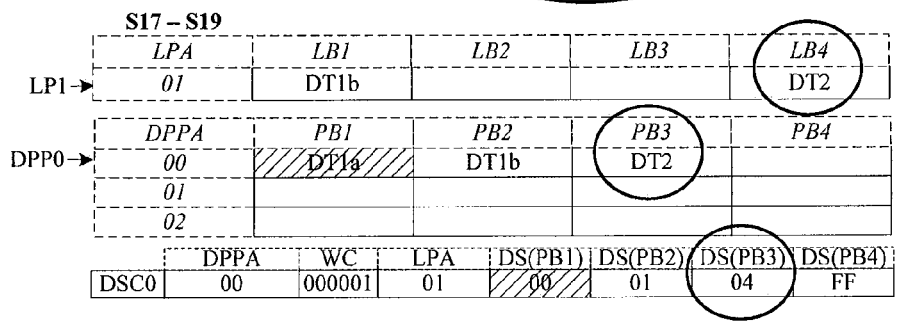

The flowchart of FIG. 4C describes the execution steps of a write command of the data DT2 in the logical block LB4 (LP1). During a step S16, the program VPG searches in the descriptors for a physical page linked to the logical page LP1, finds the page DPP0, then searches, by means of the descriptors, for an erased physical block in the page DPP0. During a step S17, the program VPG writes the data DT2 in the physical block PB3(DPP0), then writes the value 04 in the field DS(PB3) of the descriptor, Cf. FIG. 5C.

Figure 4D:
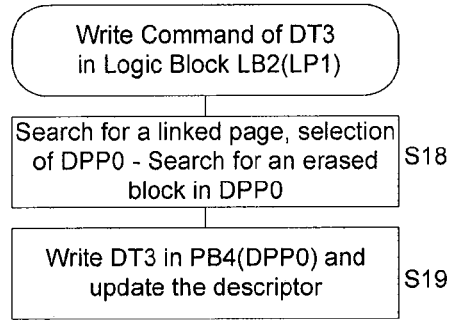
Figure 5D:
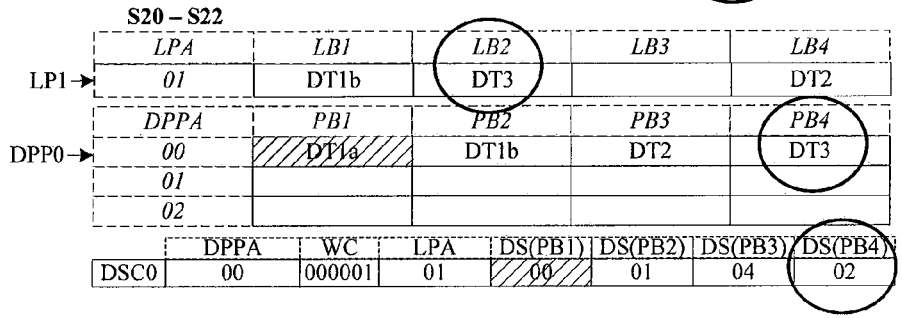
Figure 5E:
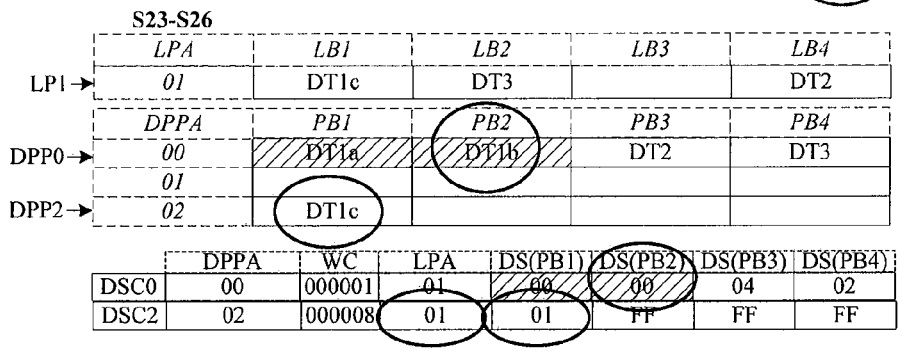

The flowchart of FIG. 4D describes the execution steps of a write command of the data DT3 in the logical block LB2 (LP1). During a step S18, the program VPG searches in the descriptors for a physical page linked to the logical page LP1, finds the page DPP0, then searches, by means of the descriptors, for an erased physical block in the page DPP0. During a step S19, the program VPG writes the data DT3 in the physical block PB4(DPP0), then writes the value 02 in the field DS(PB4) of the descriptor, Cf. FIG. 5D.

Figure 4E:
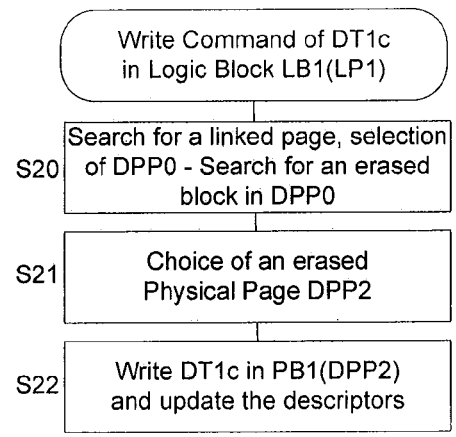

The flowchart of FIG. 4E describes the execution steps of a write command of the data DT1$c$ in the logical block LB1 (LP1). During a step S20, the program VPG searches in the descriptors for a physical page linked to the logical page LP1, finds the page DPP0, then searches, by means of the descriptors, for an erased physical block in the page DPP0. The page DPP0 being entirely written, the program VPG searches for an erased page at step S21, chooses the physical page DPP2 and updates the descriptor DSC2 of this page by writing the value 01 in the field LPA so as to link it to the logical page LP1. During a step S22, the program VPG writes the data DT1$c$ in the physical block PB1(DPP2), updates the descriptor DSC0 by writing all the bits of the field DS(PB2) of the descriptor DSC0 so as to invalidate the data DT1$b$ present in the physical block PB2(DPP0), and updates the descriptor DSC2 by writing the value 01 in the field DS(PB1).

It may be noted that the order of the operations described above is arbitrary in that it relates to the updating of descriptors. These operations may be conducted according to a determined order in the framework of the implementation of a method of protecting against power supply interruptions, which will be described later.

As it will appear in the light of the described examples, the data of a logical page may be saved in several physical pages and the data written successively in the same logical block may remain in the physical memory. Nevertheless, there may in some instances, be only one valid data per logical block, such that each writing of a data of a logical block involves the invalidation of the previously written data.

Additionally, supposing that the write method shown in FIGS. 5A to 5E continues and that the logical blocks LB3, LB4 of the page LP1 receive new data, the data DT2, DT3 present in the physical page DPP0 will be invalidated and the page DPP0 will only contain invalid data. Such a page will be invalidated then erased by the program VPG in order to free up memory space.

The erasure of a page implicates the attribution of a new descriptor to the page and the invalidation of the descriptor associated with this page. As the writing of metadata in the memory zone A2 is of the delayed-erase type and therefore comprises a data write, it is not in fact imaginable to erase the current descriptor of the page so as to set the fields LPA and DS back to "FF". Thus, the program VPG allocates a new descriptor to the page and invalidates the old descriptor by setting its field WC to 0.

It may be noted that the compact descriptor structure chosen in this example embodiment of the method imposes that a physical page only comprises data belonging to a same logical page. In embodiment variations, a descriptor structure of the type "block descriptor" may be provided and allow for the association of any logical page to any physical block of any physical page. Such a block descriptor structure would however be bulky because each block descriptor would have to comprise the addresses DPPA and LPA of the physical and logical pages with which it is associated. The page descriptors including an information about the block contents of the page thus form an advantageous means in terms of the memory zone A2 compactness.

III—Second Aspect: Page Wear Management

An inconvenience of the delayed-erase data write is that the program VPG may arbitrarily favor the cycling of certain pages to the detriment of other pages. It may happen that a same page is arbitrarily used more often than the others, and therefore more often erased than the others. For example, in the preceding it has been seen that at certain steps of the data write method, for example step S05 in FIG. 3 and step S21 in FIG. 4E, the program VPG chooses erased pages so as to write new data in them.

Metadata are also used to ensure a monitoring of the page "cycling" (that is to say the number of erase cycles that they have undergone). More particularly, a wear counter WC is attributed to each physical page of the memory zone A1, and is saved in the memory zone A2. The counter WC may be arranged in a dedicated wear descriptor in which the address of the page appears. However, in the framework of the implementation of the first aspect where page descriptors are used, it is advantageous to place this counter WC in the descriptor structure, as shown in FIG. 2.

The counter WC is for example coded on 3 bytes, as indicated above. During the first memory utilization, the program VPG initializes the counter WC of each physical page of data by writing therein a count value equal to 000001 (hexadecimal notation) at the time of the first descriptor configuration. The program VPG then increments the counter after each erase of the page. The counter WC thus accompanies the page during the entire life of the memory. In the FIGS. 5A to 5E, it may be seen for example that the counter WC of the descriptor DSC0 of the page DPP0 is equal to 000001, which signifies that the page has not yet been erased. In FIG. 5E, the counter WC of the descriptor DSC2 of the page DPP2 is equal to 000008, which signifies that the page has been erased 7 times.

Thanks to the counter WC, the cycling of data pages may be controlled by the program VPG in a dynamic and/or static manner so as to homogenize the page wear over the entire memory array. A dynamic wear management comprises for example, during the writing of data in erased physical pages, a step during which the program VPG selects erased pages having undergone the least amount of erase cycles. A static wear management comprises for example a core task (background task) comprising steps of moving valid data of a page having undergone a small number of erase cycles to a page having undergone more erase cycles, so as to free up a less-frequently cycled page so that it may be used more frequently later.

As indicated above, the erasure of a data page DPP is accompanied by the attribution of a new descriptor to the page, which implies that the invalidation of the descriptor associated with this page comprises setting the field WC to 0. So as to not lose the page wear "history", the counter WC of a descriptor destined to be invalidated is transferred beforehand into the new descriptor of the erased page.

Figure 6:
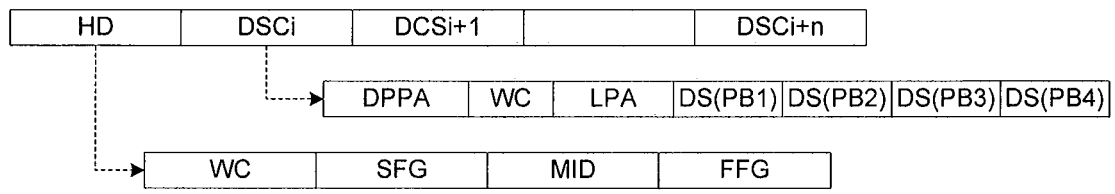
FIG. 6 shows a metadata structure of a first type.

Advantageously, the metadata page wear is equally monitored and homogenized by the program VPG by allocating to them a counter WC, here arranged on the interior of the metadata pages, in a header field HD of these pages. As shown in FIG. 6, a descriptor page comprises the header field HD and a plurality of descriptors DSCi, DSCi+1, . . . DSCi+n each comprising the fields DPPA, WC, LPA, DS(PB1), DS(PB2), DS(PB3), DS(PB4). The header field comprises:

the counter WC, of 3 bytes,
a start flag SFG, for example of 1 byte,
an identification field MID (Metadata Identifier), for example coded on 3 bytes, and
a final flag FFG, for example of 1 byte.

The flags SFG, FFG are provided in relation with an aspect that will be described later. The identification field MID is coded with a determined value, for example "3C", which indicates that the metadata page contains descriptors. The field MID is also used to invalidate the descriptor page when it only contains invalid descriptors. In this case, the field MID is completely written and its value is "00" in hexadecimal notation. Finally, when the field MID is equal to "FF", this signifies that the metadata page is available and may be used to save descriptors or any other metadata structure that will be described later.

After a certain usage of the memory, a descriptor page may, in some instances, contain only invalid descriptors, that is descriptors all relating to pages containing invalid data. The program VPG may be configured to conduct a core task that aims to find pages of invalid descriptors, then to erase them so as to free up memory space in the memory zone A2. In this case, the counter WC of the descriptor page to be erased is set aside beforehand then rewritten in the header field of the descriptor page after it has been erased.

A dynamic metadata page wear management may also be provided, and comprises for example, during the writing of metadata in erased physical pages of the memory zone A2, a step during which the program VPG selects erased pages having undergone the least number of erase cycles. A static metadata page wear management may also be provided and comprises for example a core task (background task) comprising steps of moving valid data of a page having undergone a small number of erase cycles to a page having undergone more erase cycles.

More-detailed features of the implementation of this aspect will be described later, in the framework of the description of other aspects.

IV—Third Aspect: Protection of Data Against Power Supply Interruptions

The management of the tearing and of the power supply interruptions caused by it conventionally involves the provision of specific data allowing the write and erase processes to be monitored. During a memory restart, these data are read and allow for the detection of the process interruption in order to set the memory back into its initial state and also to correct the effects of the power interruption. In the manner of conventional labeling data, the process monitoring data are, in the prior art, concatenated to the application data and become more and more complicated as one passes from a writing by page to a writing by block. Not only labeling data but also process monitoring data is concatenated with each block of application data. Moreover, as the labeling of application data with process monitoring data is not a foolproof method, incertitude remains when the memory cells receiving the process monitoring data are in an intermediary state between the programmed state and the erased state, and may be read as a "1" or a "0" depending upon external parameters such as the temperature and the circuit supply voltage, which may lead to an erroneous diagnostic. The limits of known techniques reside in the fact that the process monitoring data are concatenated to the application data and are thus attributed to a fixed memory space, inhibiting the implementation of solutions aiming to prevent diagnostic errors due to intermediate states.

Figure 7:
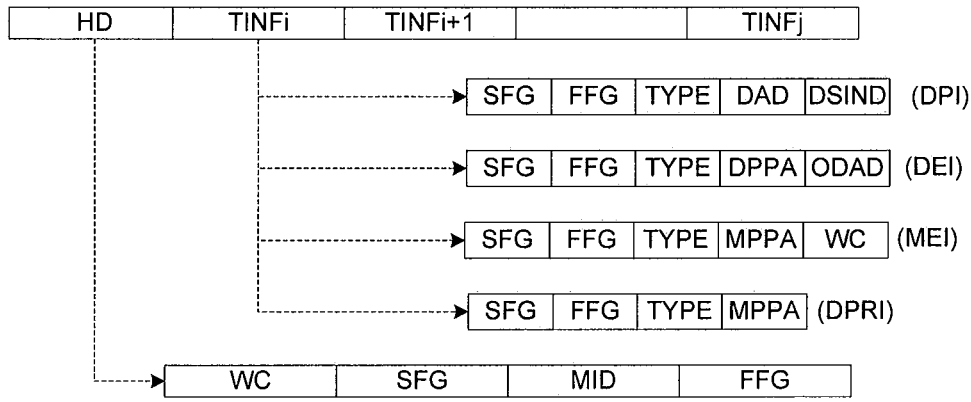
FIG. 7 shows a metadata structure of a second type.

According to this aspect, metadata of the memory zone A2 are allocated to the process monitoring. In the manner of metadata allowing for the identification of data in the memory zone A1, which are configured as descriptors, the metadata allocated to the process monitoring are configured as specific structures called "temporary information structures" TINF, as shown in FIG. 7. These metadata structures are written in specific metadata pages called "temporary information pages" of which the structure is also shown in FIG. 7.

A temporary information page comprises a header field HD following by a plurality of temporary information structures TINFi, TINFi+1, . . . TINFj. The header field is identical to that of a descriptor page and thus comprises:
   the counter WC of the page,
   the flag SFG,
   the identification field MID, and
   a flag FFG, for example of 1 byte.

The identification field MID is coded with a determined value, for example "F0", which indicates that the metadata page is a temporary information page. The field MID is also used to invalidate the temporary information page when it contains only invalid temporary information structures. In this case, the field MID is completely written and its value is equal to "00" in hexadecimal notation.

In an embodiment, the method provides:
   a temporary information structure DPI ("Data Programming Information") for the monitoring of the write process of a physical block of data in the memory zone A1,
   a temporary information structure DEI ("Data Erasing Information") for the monitoring of the erase process of a physical page of data in the memory zone A1,
   a temporary information structure MEI ("Metadata Erasing Information") for the monitoring of the erase process of a metadata page in the memory zone A2,
   a temporary information structure DPRI ("Descriptor Page Rearranging Information") for the monitoring of a process of rearranging the descriptors in the memory zone A2.

These temporary information structures will now be described in further detail in relation with their usage.

Monitoring of the Write Process of a Physical Block of data in the Memory Zone A1

The structure DPI comprises the following fields:
   a start flag SFG, for example of 1 byte
   a final flag FFG, for example of 1 byte,
   a field TYPE, for example of 1 byte, allowing the structure DPI to be identified,
   a descriptor address field DAD, for example of 1 byte,
   a DS index field DSIND, for example of 1 byte.

The field DAD receives the descriptor address of the physical page in which the data are written. This address comprises the address MPPA of the metadata page in which are found the descriptor (expressed in the form of an index calculated relative to the first page of the second memory zone A2), and the index DIND of the descriptor in the metadata page. The field DSIND receives the index, in the descriptor, of the field DS concerned by the write operation. As 4 bits suffice to designate the four possible index values in a virtual memory of four blocks per logical page, the four other bits of the field DSIND may be used to store the value to be written in the field DS. As indicated above, this value is the index, in the logical page, of the logical block of which the data is to be written in the physical block.

The program VPG configures the structure DPI in several steps before the writing of a data in a physical block of the memory zone A1:
   1) writing of half of the flag SFG bits,
   2) writing of the field TYPE, of the field DAD, and of the field DSIND,
   3) writing of the other flag SFG bits.

The write operation of the block is then performed. When this operation is finished, the program VPG writes the final flag FFG.

The start flag SFG being written in two steps, it is equivalent to two flags, that is a first process start flag and a second process start flag, allowing for the organization of the writing process of the fields TYPE, DAD, and DSIND of the temporary information structure.

Monitoring of the Erase Process of a Physical Page of Data in the Memory Zone A1

The structure DEI comprises the following fields:
   a start flag SFG, for example of 1 byte,
   a final flag FFG, for example of 1 byte,
   a field TYPE, for example of 1 byte, allowing the structure DEI to be identified,
   a Data Physical Page Address field "DPPA", for example of 2 bytes,
   an Old Descriptor Address field "ODAD", for example of 2 bytes, The field DPPA, already described above, receives the address of the physical page of data to erase, in the form of an index. The field ODAD contains the address of the old descriptor, which is the descriptor of the page before its erasure. Indeed, as indicated above, the erasure of a page is necessarily accompanied by the writing of a new descriptor.

The program VPG configures the structure DEI in several steps before a page is erased:
   1) writing of half of the flag SFG bits,
   2) writing of the field TYPE, of the field DPPA, and of the field OAD,
   3) writing of the other flag SFG bits, When the erase operation of the data page is finished, the program VPG writes the final flag FFG.

Monitoring of the Erase Process of a Metadata Page in the Memory Zone A2

The structure MEI comprises the following fields:
   a start flag SFG, for example of 1 byte,
   a final flag FFG, for example of 1 byte,
   a field TYPE, for example of 1 byte, allowing the structure MEI to be identified,
   a Metadata Physical Page Address field MPPA, for example of 2 bytes, and
   a Wear Counter field "WC", of 3 bytes.

The field MPPA, already described above, receives the address of the metadata page to erase, in the form of an index. The field WC receives the wear counter WC value of the metadata page to erase.

The program VPG configures the structure MEI in several steps before a metadata page is erased:
   1) writing of half of the flag SFG bits,
   2) writing of the field TYPE, of the field MPPA, and of the field WC,
   3) writing of the other flag SFG bits.

When the page erase operation is finished, the program VPG recopies the counter WC value in the field WC that is located in the header of the erased page, then programs the final flag FFG.

Monitoring of a Rearrangement Process of Descriptors in the Memory Zone A2

The rearrangement of descriptors is a background task that may be performed by the program VPG to regroup the valid descriptors in the same descriptor page. It implicates the invalidation of initial descriptors. This task allows descriptor pages only containing invalid descriptors to appear, which may then be erased, and to increase the concentration of valid descriptors in the valid descriptor pages. This task may also be performed in the framework of a static metadata page wear management to transfer descriptors into the pages having undergone more erase cycles, which have counters WC with higher values.

As the descriptors are to be protected against the power supply interruptions while they are being moved from one page to another, the temporary information structure DPRI is provided to perform this task. It comprises the following fields:
 a start flag SFG, for example of 1 byte,
 a final flag FFG, for example of 1 byte,
 a field TYPE, for example of 1 byte, allowing the structure DPRI to be identified,
 a Metadata Physical Page Address field MPPA, for example of 2 bytes.

The field MPPA receives the address MPPA of the metadata page in which valid descriptors will be read and moved into a new page, expressed in the form of an index.

The program VPG configures the temporary information structure MEI in several steps:
 1) writing of half of the flag SFG bits,
 2) writing of the field TYPE and of the field MPPA,
 3) writing of the other flag SFG bits.

Then, the program VPG moves the valid descriptors to the other page, then invalidates the source page by writing all the bits of the field MID of the page, as described above. The page will be erased by another background task, or "Garbage Collection" task, ensuring the erasure of invalid pages.

When the transfer operation of descriptors is completed, the program VPG writes the final flag FFG of the temporary information structure.

Monitoring of the Write Process of the Descriptors

In addition to the information appearing in the temporary information structures, this monitoring is also ensured by means of byte redundancy in the fields DS of the descriptors, described above. In each field DS, the redundant byte is written after the first byte of the field has been written. If a power supply interruption occurs during the writing of this field, the difference between the first and the second byte allows for the detection of the write process interruption.

Monitoring of a Write Process of Metadata Page Headers

The start flags SFG and the final flags FFG provided in the metadata page headers also allow the program VPG to detect that a power supply interruption has occurred during the writing of the headers, the final flag of the header being written last.

Execution of an Anti-Tearing Algorithm Upon Power On

Upon a power on, the program VPG executes an antitearing algorithm (i.e., that aims to counter the effects of a power supply interruption) and analyses the flags SFG, FFG present in the temporary information structures, in the descriptor page headers, and in the temporary information page headers to detect any possible anomalies. It also looks for byte redundancy anomalies in the descriptors if an incoherency has been detected in the flags. A diagnostic is then established to define, if desired, the actions to be performed in order to restore the memory into its initial state, that is to say its configuration before the operation (write or erase) was launched, which was then interrupted by the power supply interruption.

The analysis of temporary information metadata is for example performed in the following order:
 1) verification of the validity of all the page headers,
 2) search for the two last temporary information structures,
 3) setting of instable pages detected by rewriting of bits already written or recopied from these pages and invalidation of initial pages,
 4) analysis of the temporary information structures and treatment of them.

An anomaly is for example noticed when two flags of a same structure (temporary information or header) do not have the same value, which means that a process was interrupted. The process that was interrupted may be known by the field TYPE of the temporary information structures. Where the anomaly relates to a temporary information structure, the program VPG recopies this structure into a temporary information page of the memory zone A2 to stabilize it, before proceeding with a data analysis so as to establish a diagnostic and before defining any possible corrective actions. When the erroneous temporary information structure has been recopied, the initial temporary information structure is neutralized by writing of its erased bits (going from 1 to 0) and overwriting of its programmed bits.

For example, a final flag FFG may be in an intermediary state if a power interruption occurred while the program VPG was in the process of writing it. Such a flag may be read to be equal to 1 at the power on, which is considered to be an anomaly because the start flag is written and is thus equal to 0. Nevertheless, this same final flag may then be read to be equal to 0 at the following power on if a new power supply interruption occurs after the memory re-start and before the program VPG had the time to establish a diagnostic. This change of the read value of the flag may depend upon external parameters such as the temperature or the circuit power supply.

As a precautionary measure, recopying the temporary information structure and neutralizing the initial temporary information structure considered as "potentially unstable" (because it may not be known whether it is really stable) thus allows it to be stabilized. If a new power supply interruption occurs during the writing of the temporary information structure copy, such that the new structure itself has an error, then a copy of the new temporary information structure during the next power on will allow it to be stabilized and a diagnostic to be established. Thus, the fact of recopying the temporary information structure and of neutralizing the initial temporary information structure allow diagnostic errors due to memory cells in an intermediary state to be avoided.

It may be noted that such a copy operation is impossible to implement in a conventional memory where the process monitoring data are written in fixed-size fields provided at the start or the end of a page. A memory space dedicated to metadata and the ability to be able to reprogram the temporary information structures so as to stabilize them thus offer unexpected advantages.

Descriptors having an anomaly may also be recopied. If a descriptor has a byte redundancy error (bytes not having the same value), the descriptor is recopied in order to stabilize it and the initial descriptor is invalidated. In some instances, this operation is only performed if, at the moment of power interruption, the erroneous descriptor was in the process of being written in relation with a data write operation in a physical block (the nature of the operation is determined by the field TYPE of the temporary information structure, which is thus information of the type DPI).

The header fields having an anomaly however are not recopied and are simply overwritten because they do not have the same instability and validity problems: at the time when they are overwritten, the algorithm is in a stable state and at the next power on, they will necessarily be rewritten with the same value.

V—Fourth Aspect: Provision of a Look-Up Table Pointing Towards the Metadata

In order to simplify the work of the processor performing the memory management, it is common in the prior art to call upon a look-up table located in the volatile memory, allowing the location of the labeled pages in the memory array to be determined. The look-up table comprises a list of labels and, in relation with each label, a physical address of the data carrying this label. In the framework of the implementation of a method of writing per block with a delayed erase, the increase of the number of labels also entails a proportional complication of the look-up table structure and of the volatile memory size. A look-up table with a compact size may therefore be desired.

In an embodiment, the program VPG uses a compact look-up table LUT to access the memory NVM. The look-up table is stored in the volatile memory VM of the integrated circuit (Cf. FIG. 1) and is reconstructed, from a reading of the metadata, by the program VPG at each startup of the integrated circuit.

The look-up table LUT does not point towards the memory zone A1 where the data are located, but points towards the memory zone A2 where the metadata are located. In other words, the look-up table supplies descriptor addresses DAD. These addresses comprise an address MPPA of a descriptor page and the index DIND of a descriptor in this page. The look-up table is also used by the program VPG to manage and update a list of invalid pages which are to be erased, as well as to manage and update a list of erased pages.

Figure 8:
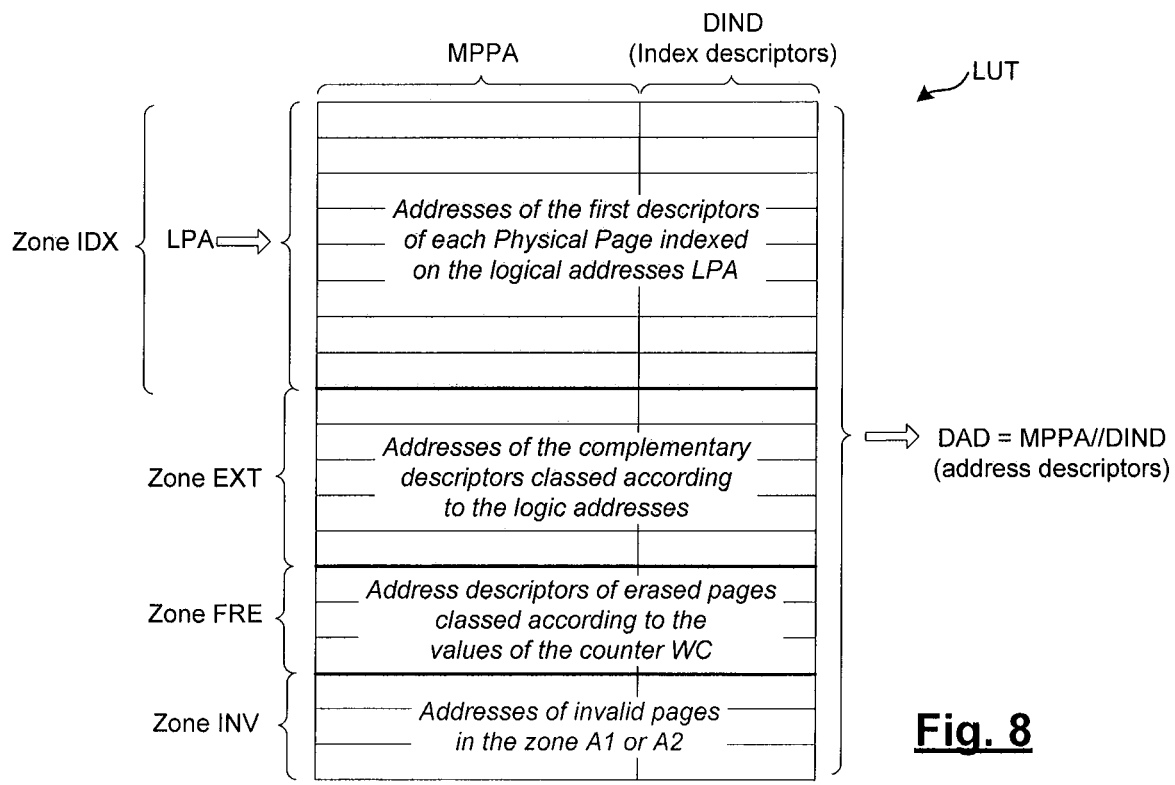
FIG. 8 shows schematically a configuration of a look-up table.

FIG. 8 shows schematically a structural example of the look-up table LUT. The look-up table has four distinct zones, a zone IDX, a zone EXT, a zone FRE, and a zone INV.

The zone IDX contains addresses of descriptors indexed on the logical addresses LPA. Each address $LPA_i$ corresponds to the address of a valid descriptor comprising this address in its field LPA. The zone EXT also contains descriptor addresses, but these addresses are not indexed to the logical addresses LPA and are classed by increasing order of the logical addresses that are in the field LPA of the descriptors.

The zone FRE contains descriptor addresses associated with erased pages of the memory zone A1, that is descriptors of which the fields DPA and DS are in the erased state (the fields DPPA and WC being however referenced upon the formation of the descriptors, as described above). The descriptor addresses are classed therein by increasing order (or, optionally, by decreasing order) of their counter WC values. In other words, the address of the first descriptor at the top of the zone FRE (or at the bottom, if decreasing order) is that of the erased descriptor having the lowest counter WC value and having thus undergone the fewest erase cycles.

The zone INV contains addresses of all the pages of invalid data present in the memory zone A1. This zone is used by the program VPG to execute a core task aiming to free up memory space by the erasure of invalid pages.

Construction of the Look-Up Table

The program VPG constructs the look-up table LUT upon each power on of the integrated circuit. To this end, it sweeps all the descriptor pages and searches, for each logical address $LPA_i$, for the valid descriptors of which the field LPA comprises this address $LPA_i$. The first descriptor found is placed in the zone IDX and is associated with the logical address $LPA_i$. The other descriptors found meeting this criteria are placed in the zone EXT and are classed by increasing order of the addresses LPA that they contain. Once all the logical addresses of the virtual memory space have been swept, the look-up table comprises in its zone IDX and in its zone EXT all the addresses of valid descriptors associated with physical pages that comprise at least one valid data of the virtual memory.

The zone EXT is constructed simultaneously to this sweep, by storing therein the descriptor addresses of which the field LPA was found to be in the erased state, and by classing them by increasing (or decreasing) counter WC values that they comprise. Similarly, the zone INV may be constructed simultaneously by storing therein the descriptor addresses of which the four fields DS are found to be equal to 0.

Utilization of the Look-Up Table

When the program VPG receives a write or read command of a logical block, the physical address of the logical block is first determined in order to execute the command.

First of all, the program VPG extracts from the address of the logical block the address $LPA_i$ of the logical page in which the logical block is found and searches in the zone IDX, by means of this address $LPA_i$, for the address of a descriptor. This step will now be described.

Search for a Descriptor by Means of the Zone IDX

Several cases may be envisaged:

i) The zone IDX does not contain any descriptor associated with the logical address $LPA_i$:

a) the command is a write command:

In this case the program VPG goes into the zone FRE and chooses the address of the descriptor that is on top of the list, to write the data in the physical page having undergone the least number of erase cycles among all the available erased pages. The address of this page is determined by reading the field DPPA of the selected descriptor.

b) the command is a read command:

In this case, the absence of a descriptor signifies that no data have been written at this logical address. The program VPG therefore returns the value "FF" signifying that the logical block is blank. Alternatively, the program VPG sends an appropriate response determined by a communication protocol between the program VPG and the application that uses it.

ii) The zone IDX contains the descriptor associated with the logical address $LPA_i$ and supplies a descriptor address:

a) If the command is a read command, the program VPG reads the descriptor and searches for the field DS containing a value equal to the logical block index in the logical page, and deduces the index in the physical page of which the address DPPA appears in the descriptor of the physical block containing the searched-for data. The program VPG is thus able to reconstruct the targeted address by combining the address DPPA and the physical block index, and to read the data. If no field DS containing the logical block index is found in the descriptor, the program VPG continues the search in the zone EXT of the look-up table.

b) If the command is a write command, the program VPG searches for the first erased field DS in the descriptor. If the descriptor only contains occupied fields DS, the program VPG continues the search for the descriptor in the zone EXT of the look-up table.

Search for Other Descriptors by Means of the Zone EXT

This zone not being indexed, the program VPG itself finds the descriptor or the descriptors that comprise the address $LPA_i$. As the descriptors are classed therein by increasing order of the logical addresses LPA with which they are associated, the program VPG uses a convergent search method by successive approaches that may involve the reading of several descriptors not comprising the correct address $LPA_i$ but which allows it to rapidly converge upon the descriptor comprising this address, if one exists.

When the descriptor is found, the program VPG, if it is in the process of executing a write command, proceeds as it did with the first descriptor found by means of the zone IDX, and so forth until it finds the descriptor comprising the address $LPA_i$ and an erased field DS. If all the fields DS are occupied or invalid, the program VPG goes into the zone FRE to select an erased page descriptor.

If it is in the process of executing a read command, the program VPG proceeds as it did with the first descriptor found by means of the zone IDX, and so forth until it finds the descriptor comprising the address $LPA_i$ and a field DS comprising the logical block index to be read. If none of the fields DS comprise this index, this means that no data were programmed in this logical block. The program VPG therefore responds to the command by sending the value "FF" signifying that the logical block is blank or sends an appropriate response.

Invalidation of a Previous Data

When the received command is a write command, it may involve invalidation of a previous data having the same logical address. Indeed, a field DS having the same index and thus designating a physical block containing a data of the same logical address may exist in a descriptor associated with the address $LPA_i$. This data will become obsolete after the writing of the new data and this field DS is therefore invalidated, as indicated above in relation with the FIGS. 5A to 5E.

Therefore, throughout the reading of the descriptors associated with the logical address $LPA_i$, the program VPG also searches for a descriptor associated with the target address $LPA_i$ and that comprises a field DS containing the same logical block index as that of the target logical block, and save the descriptor address as well as the index of the field DS. Thus, the program VPG does not stop at the searched-for descriptor to write the data, but sweeps the ensemble of the descriptors comprising the address $LPA_i$ to confirm that a previously-written data having the same logical address does not exist in the memory zone A1.

Figure 9:
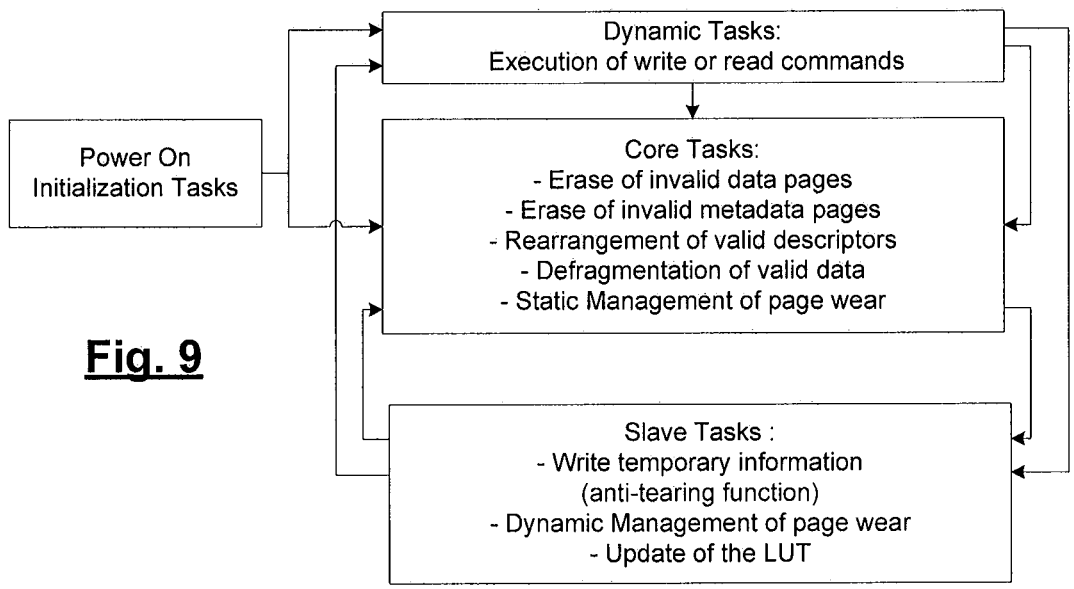
FIG. 9 is a schematic representation of various tasks that may be implemented by the integrated circuit.

VI—General Architecture Example of the Program VPG Implementing the Four Example Aspects FIG. 9 is a general view of tasks that may be performed by the program VPG, in an embodiment implementing the four aspects. After the power on of the integrated circuit, initialization tasks are first performed. The program VPG then performs dynamic tasks and slave tasks.

Initialization Tasks

Figure 10:
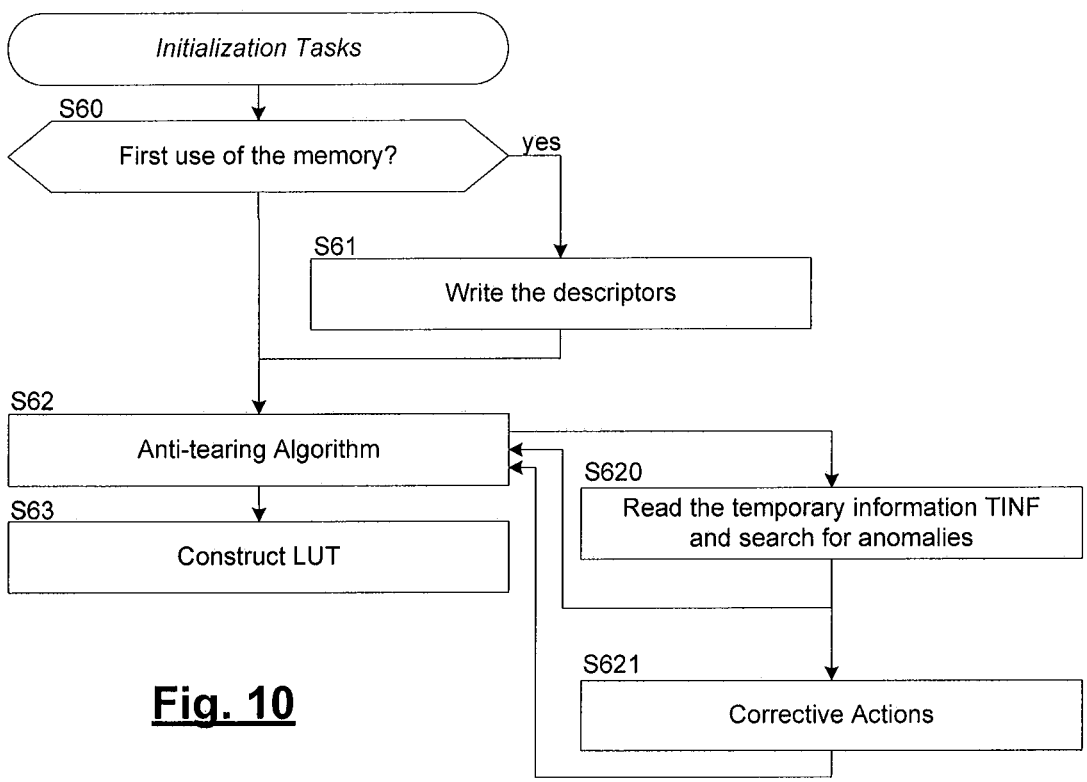
FIG. 10 is a flowchart describing initialization tasks performed by the integrated circuit upon its power on, FIGS. 11 and 12 are flowcharts respectively describing the implementation of a data write command and of a data read command in the memory of the integrated circuit.

A flowchart that summarizes the principal steps of these tasks is shown in FIG. 10. The steps appearing in this flowchart will be described later.

Dynamic Tasks

Once the initialization tasks have been done, the program VPG performs dynamic tasks or core tasks. The dynamic tasks are for example the execution of write or read commands, or any other external command that may be provided, for example the execution of an invalidation command of a logical page.

Execution of a Write Command

Figure 11:
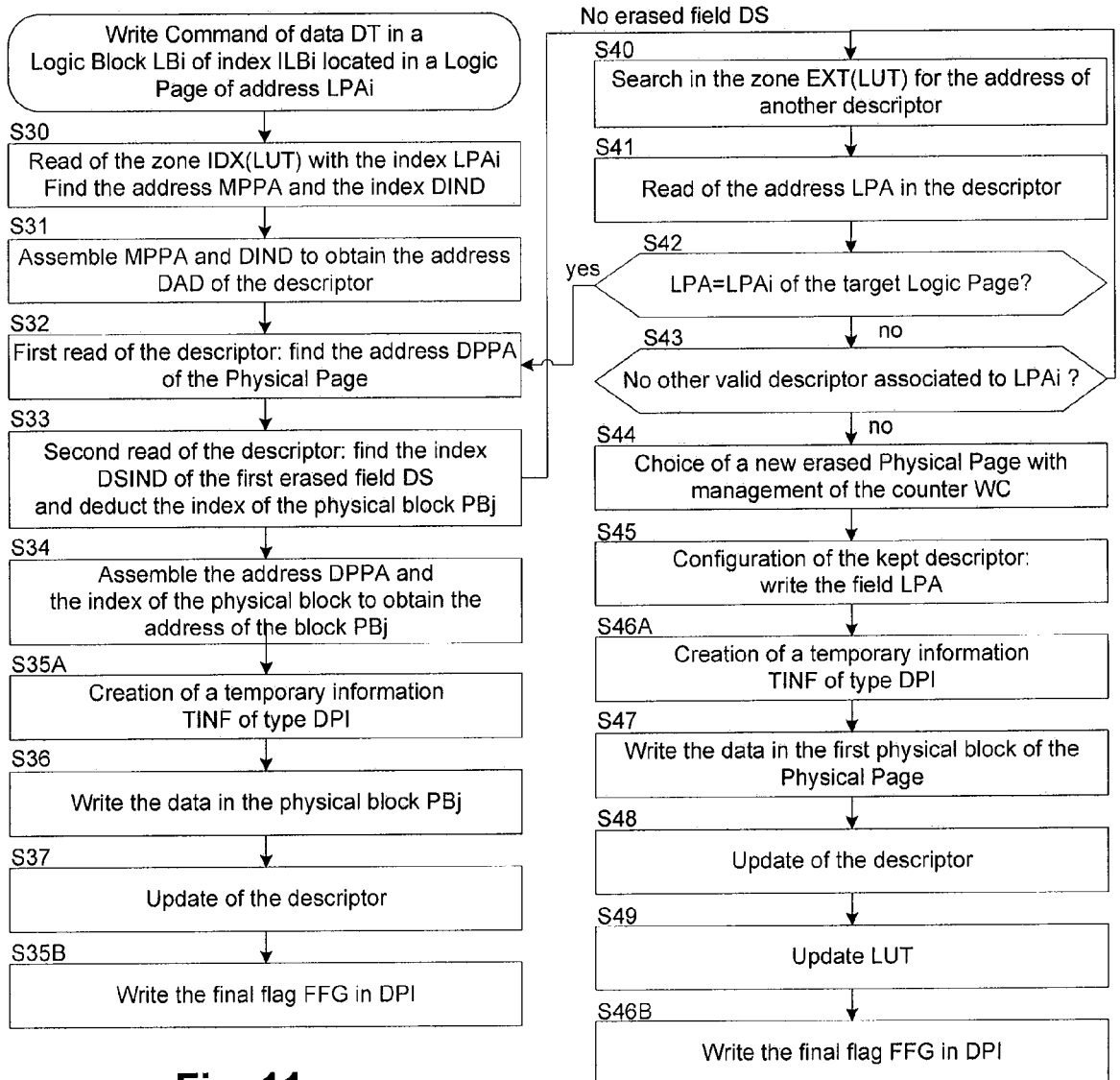

The execution of a write command has already been described throughout the entire preceding description. FIG. 11, described below, shows a flowchart that summarizes execution steps of the command with an implementation of aspects described herein.

Execution of a Read Command

Figure 12:
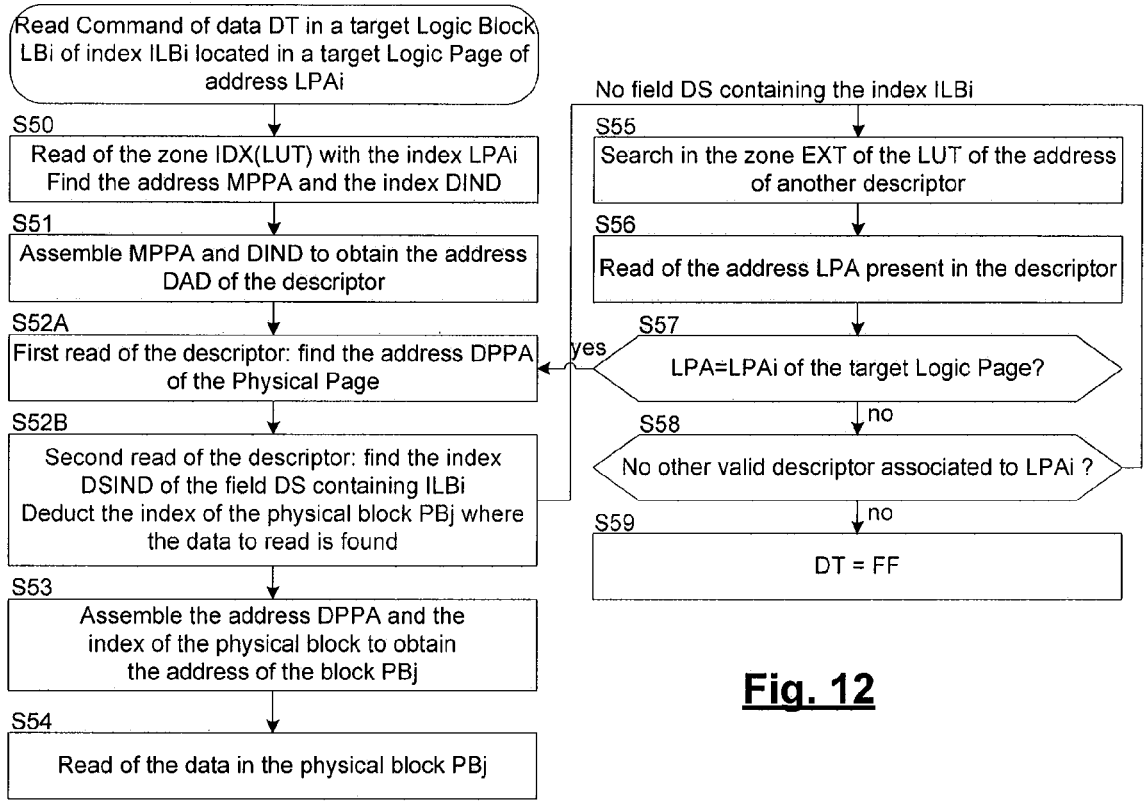

The execution of a read command has already been described throughout the entire preceding description. FIG. 12, described below, shows a flowchart that summarizes the steps of the command with an implementation the aspects described herein.

Core Tasks

The core tasks are executed in the absence of an execution command but may also be performed before the execution of a command, if desired. Among the core tasks, the following tasks may be noted:

Erasure of Invalid Data Pages

Figure 13:
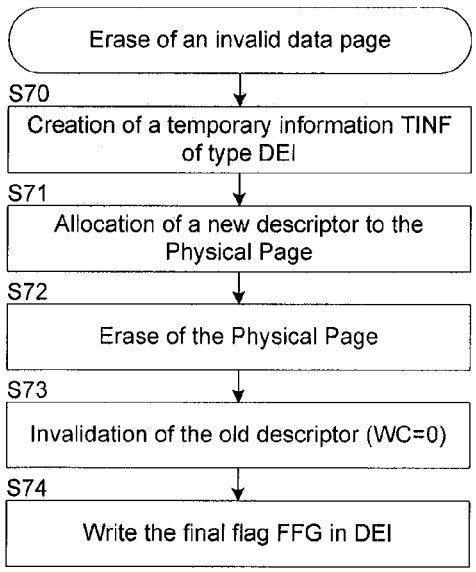
FIGS. 13 to 16 are flowcharts describing memory maintenance tasks implemented by the integrated circuit.

A flowchart that summarizes the principal steps of this task is shown in FIG. 13. The steps of this flowchart are described later.

Erasure of Invalid Metadata Pages

Figure 14:
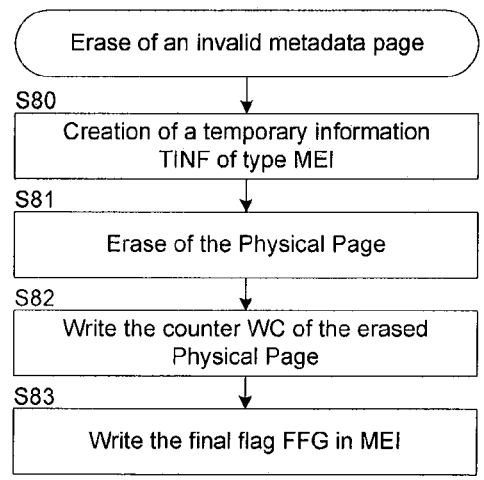

A flowchart that summarizes the principal steps of this task is shown in FIG. 14. The steps of this flowchart are described later.

Rearrangement of Valid Descriptors

Figure 15:
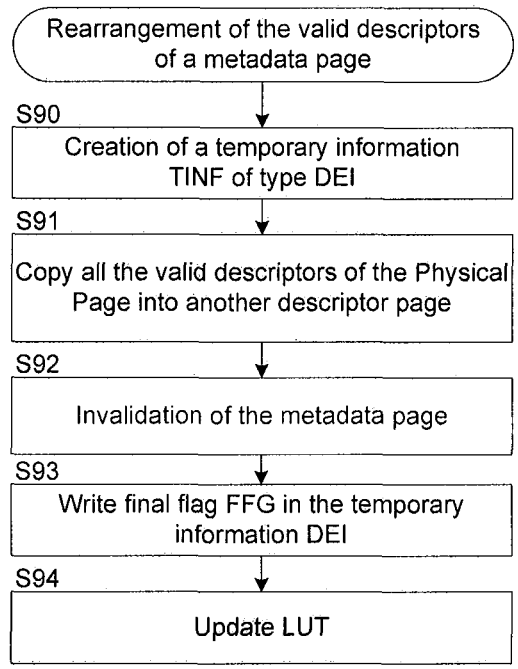

A flowchart that summarizes the principal steps of this task is shown in FIG. 15. The steps of this flowchart are described later.

Defragmentation of Valid Data

Figure 16:
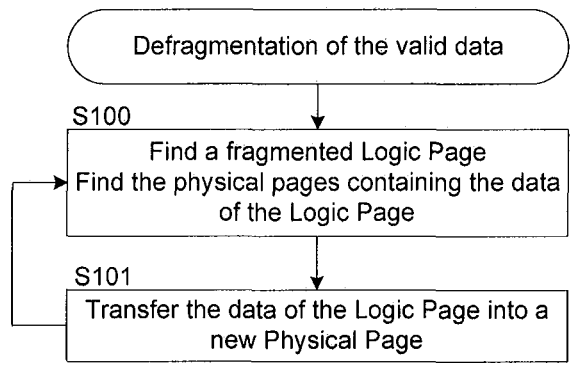

A flowchart that summarizes the principal steps of this task is shown in FIG. 16. The steps of this flowchart are described later.

Static Page Wear Management

The task of static page wear management comprises transferring the data or the metadata into the erased data or metadata pages having a counter WC with a higher value.

Slave Tasks

The so-called "slave" tasks are those that are implemented at the same time as dynamic tasks or core tasks, and mainly relate to writing temporary information structures for the anti-tearing algorithm implementation and to updating the look-up table LUT.

The programming of the temporary information structures, already described above, is done in relation with any task or command execution for which a temporary information structure is provided, that is here the writing of a physical block of data (temporary information structure DPI), the erasure of a physical page of data (temporary information structure DEI), the erasure of a metadata page (temporary information structure MEI), and the rearrangement of descriptors (temporary information structure DPRI).

The dynamic wear management has been described above in relation with the description of the counter WC and may be facilitated by the use of the look-up table LUT (zone FRE of the table) as far as it relates to the data pages. As far as it relates to the metadata pages, the program VPG performs this task "on the fly" when the erased metadata pages are chosen, by reading the counters WC present in the header fields of these pages, and by selecting the page having the lowest counter WC value.

Description of the Flowcharts

FIG. 10

The flowchart of FIG. 10 describes examples of initialization tasks after power on:

During a step S60 the program VPG determines whether the memory is used for the first time, for example by determining whether the memory zone A2 comprises metadata.

If the memory is blank, the program VPG executes a step S61 where it programs all the descriptors at the rate of one descriptor per physical page:

All the counters WC of the descriptors are set to 1 (000001)

The address DPPA of the physical page allocated to each descriptor is programmed in the corresponding field.

During a step S62, the program VPG executes the anti-tearing algorithm:

During a step S620, it reads the temporary information structures TINF and searches for an anomaly.

During a step S621, it reprograms the temporary information structure having the anomaly, if desired, then neutralizes the initial temporary information structure having the anomaly, analyzes the data concerned by the interrupted operation, establishes a diagnostic, and puts the memory back into the state in which it was before interrupted operation began.

During a step S63 the program VPG constructs the look-up table LUT from a reading of the metadata.

FIG. 11

The flowchart of FIG. 11 describes the execution of a write command of a data DT in a target logical block LBi of index $ILB_i$ of a target logical page address $LPA_i$.

During a step S30, the program VPG reads the zone IDX of the look-up table LUT by using the address $LPA_i$ as index to find the address MPPA of the descriptor page linked to the target logical page and the index DIND of the descriptor in the descriptor page.

During a step S31, the program VPG assembles the fields MPPA and DIND to obtain the descriptor address DAD.

During a step S32, the program VPG performs a first reading of the descriptors to find the address DPPA of the target physical page linked to the target logical page.

During a step S33, the program VPG performs a second reading of the descriptors to find the index DSIND first erased field DS (FF) and deduces the index of the target erased physical block PBj available to program the data.

During a step S34, the program VPG assembles the address DPPA and the physical block index to obtain the address of the physical block PBj.

During a step S35A, the program VPG creates a temporary information structure TINF of the type DPI, and writes the following fields: a part of the flag SFG, the field TYPE, the field DAD (descriptor address), the index DSIND of the field DS, and the value of the field DS, then the rest of the flag SFG.

During a step S36, the program VPG writes the data in the physical block PBj.

During a step S37, the program VPG updates the descriptor by writing, in the erased field DS, the index $ILB_i$ of the target logical block LBi.

During a step S35B, the program VPG programs the final flag FFG in the temporary information structure DPI.

After the step S33, if it does not find an erased field DS in the descriptor, the program VPG goes to a step S40 instead of going to the step S34.

During the step S40, the program VPG searches in the look-up table LUT zone EXT for the address of another descriptor.

During a step S41, it reads the address field LPA present in the descriptor.

During a step S42, the program VPG verifies whether the contents of the LPA are equal to the address $LPA_i$ of the target logical page. If the response is positive, the program VPG returns to the step S32 to analyze the descriptor. If the response is negative, the program VPG goes to a step S43.

During the step S43, the program VPG determines whether the look-up table LUT may contain another descriptor address associated with the target logical page. The response is negative if the search by successive approaches described above already allowed an examination of all the address descriptors LPA close to LPAi (that is $LPA_{i-1}$ and $LPA_{i+1}$) and no descriptor address exists between the already-analyzed descriptor addresses. In this case, the program VPG goes to a step S44. If the search is not finished, the program VPG returns to the step S40.

During the step S44, the program VPG chooses a new erased physical page all while applying the dynamic page wear management algorithm by means of the counter WC, by searching for a descriptor having a counter WC with a low value and for erased fields LPA. The erased physical page address is read in the descriptor field DPPA.

During a step S45, the program VPG configures the descriptor of the chosen page by writing the descriptor field LPA.

During a step S46A, the program VPG creates a temporary information structure TINF of the type DPI, and writes the following fields: a part of the flag SFG, the field TYPE, the descriptor address field DAD, the index DSIND of the field DS, and the value of the field DS, then the rest of the flag SFG.

During a step S47, the program VPG writes the data in the first physical block of the chosen physical page.

During a step S48, it updates the descriptor by writing, in the first descriptor field DS, the index $ILB_i$ of the target logical block LBi.

During a step S49, the program VPG updates the look-up table LUT.

During a step S46B, it writes the final flag FFG in the temporary information structure DPI.

It may be noted that the flowchart that has just been described does not show, for reasons of simplicity of the drawing, the step described further above of searching for a descriptor of the same address LPA having a field DS with the same index $ILB_i$ as the target logical block, so as to invalidate the field DS of this descriptor.

FIG. 12

The flowchart of FIG. 12 describes the execution of a read command of a data DT in a target logical block LBi of index $ILB_i$ of a target logical page address LPA.

During a step S50, the program VPG reads the zone IDX of the LUT by using the address $LPA_i$ as index, to find the address MPPA of the descriptor page linked to the target logical page and the descriptor index DIND in the descriptor page.

During a step S51, the program VPG assembles the address MPPA and the index DIND to obtain the descriptor address DAD.

During a step S52A, the program VPG performs a first reading of the descriptors to find the address DPPA of the target physical page linked to the target logical page.

During a step S52B, it performs a second reading of the descriptors to find the index DSIND of the field DS containing the index $ILB_i$ of the target logical block LBi, and deduces the index of the target physical block PBj where the data to read are found. If no field DS is found with this index, the program VPG goes to a step S55, otherwise it goes to a step S53.

During the step S53, the program VPG assembles the address DPPA and the physical index block to obtain the address of the physical block PBj.

During the step S54, the program VPG reads the data in the physical block PBj and supplies them to the emitter of the command.

During the step S55, the program VPG searches in the look-up table LUT zone EXT for the address of another descriptor.

During a step S56, it reads the address LPA present in the descriptor.

During a step S57, the program VPG verifies whether the field LPA contains the address $LPA_i$ of the target logical page. If the response is positive, it goes to the step 52A to analyze the descriptor, otherwise it goes to a step S58.

During a step S58, the program VPG determines whether the look-up table LUT may contain another descriptor address associated with the target logical page. The response is negative if the above-described search by successive approaches allowed all the address descriptors LPA to be examined. In this case, the program VPG goes to a step S59. If the search is not finished, the program VPG returns to the step S55.

During the step S59, the program VPG concludes that the logical block has never been written, and sends to the command emitter a data DT=FF or a response provided in the command emitter's communication protocol.

FIG. 13

The flowchart of FIG. 13 describes an erase operation of an invalid data page.

During a step S70, the program VPG creates a temporary information structure TINF of the type DEI and writes the following fields: a part of the flag SFG, the field TYPE, the address field DPPA of the physical page to erase, the field ODAD containing the descriptor address of the physical page to erase, then the rest of the flag SFG.

During a step S71, the program VPG allocates a new descriptor to the physical page in a metadata page, writes the field DPPA, and writes an incremented counter WC (WC=WC+1) value of the initial descriptor.

During a step S72, it erases the physical page.

During a step S73, it invalidates the old descriptor by setting its field WC to 0.

During a step S74, the program VPG writes the final flag FFG in the temporary information structure DEI.

FIG. 14

The flowchart of FIG. 14 describes an erase operation of an invalid metadata page.

During a step S80, the program VPG creates a temporary information structure TINF of the type MEI and programs the following fields: a part of the flag SFG, the field TYPE, the address MPPA of the physical page to erase, the field WC, the counter WC value of the page (header), then the rest of the flag SFG.

During a step S81, the program VPG erases the physical page.

During a step S82, the program VPG writes the counter WC of the erased physical page with the value saved in the temporary information structure.

During a step S83, the program VPG writes the final flag FFG in the temporary information structure MEI.

FIG. 15

The flowchart of FIG. 15 describes a rearrangement operation of valid descriptors of a metadata page.

During a step S90, the program VPG creates a temporary information structure TINF of type DEI and writes the following fields: a part of the flag SFG, the field TYPE, the address field MPPA of the physical page containing the valid descriptors to move, then the rest of the flag SFG.

During a step S91, the program VPG copies all the valid descriptors of the physical page into the free descriptors (DPPA=FF) of another descriptor page containing only valid descriptors or the lowest possible number of invalid descriptors.

During a step S92, the program VPG invalidates the metadata page by setting the flag SFG to 0, then by setting the field MID to 0, and finally by setting the flag FFG to 0.

During a step S93, the program VPG writes the final flag FFG in the temporary information structure DEI.

During a step S94, the program VPG updates the look-up table LUT.

FIG. 16

The flowchart of FIG. 16 describes a defragmentation operation of valid data.

During a step S100, the program VPG looks for a fragmented logical page by searching, by means of the descriptors, for the physical pages linked to this page and containing valid data. A logical page is fragmented if the data that it contains are dispersed throughout several physical pages.

During a step S101, the program VPG generates internal commands to write, in a new erased page, data of the logical page that are present in dispersed physical blocks, then it invalidates the source physical blocks. The operation includes the dynamic wear management (selection of an erased page having the lowest counter WC) and is secured by means of the temporary information structures. The descriptors of the new page are updated, as well as the descriptors of the initial pages. The look-up table LUT is also updated.

Above, various aspects have been described, that is:
the provision of a memory zone dedicated to the storing of metadata that allows a connection to be made between logical blocks and physical blocks and also allows for the management of information about the status, valid or invalid, of data in the physical blocks;
the provision of compact metadata structures of the page descriptor type;
the provision of wear counters WC associated with pages of the memory to implement a method of dynamic page wear management and optionally a method of static wear management;
the provision of a memory zone dedicated to the storing of metadata forming wear counters WC;
the provision of a memory zone dedicated to the storing of metadata structured as temporary information ensuring a monitoring of the method and to implement an anti-tearing algorithm during the power on of the memory;
the provision of a look-up table pointing towards metadata addresses instead of pointing towards data addresses, and also facilitating the page wear management and the invalid page erasure.

Each of these aspects may be implemented alone or in combination with all or only some of the other aspects described herein. For example, temporary information structures may be provided in a memory without delayed erase, not requiring metadata of the descriptor type. Equally, wear counters may be provided without using metadata of the descriptor type or of the "temporary information" type. The look-up table LUT may also be used in relation with metadata structures different than those which have been proposed in the preceding as an implementation example.

The embodiments described herein are equally susceptible to various applications. The methods described herein may be applied to any type of memory in which data is to be erased before being written, for example FLASH and EEPROM memories. Notably, the aspect relating to the utilization of metadata of the descriptor type is advantageously applied to a FLASH memory by making it such that a "physical page" and a "logical page" within the meaning of the method correspond to an erasable material page of the FLASH memory. In other applications, a "physical page" may in some instances not comprise the smallest erasable part of the memory used. For example, in a memory erasable by half-page, a physical page within the meaning of the method may include two half pages and thus correspond to a material page of the memory. In a memory erasable by block, with N blocks per page, a "physical page" within the meaning of the method may include M erasable blocks and may or may not correspond to a material page of the memory, depending on whether M and N are equal or not.

The various embodiments described above can be combined to provide further embodiments. Aspects of the embodiments can be modified, if necessary to employ concepts of the various patents, applications and publications to provide yet further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method for writing and reading data in electrically erasable and programmable nonvolatile memory cells comprising:
   writing data in a block of a first nonvolatile memory zone that is programmable by block;
   in conjunction with the writing the data in the block of the first nonvolatile memory zone, writing in a second nonvolatile memory zone containing metadata associated with data in the first nonvolatile memory zone, metadata associated with the writing of the data in the block, the metadata being written in a temporary information structure associated with the writing of the data in the block, wherein the temporary information structure associated with the writing of the data in the block includes:
   a start flag;
   an identifier of the temporary information structure;
   an information about a location of the block in the first nonvolatile memory zone; and
   a final flag; and
   in conjunction with a power-on of the first nonvolatile memory zone, searching for an anomaly in temporary information structures present in the second nonvolatile memory zone, wherein the writing the data in the block of the first nonvolatile memory zone includes:
   writing a first part of the start flag;
   writing the identifier of the temporary information structure and the information about the location of the block in the first nonvolatile memory zone;
   writing a second part of the start flag;
   writing the data in the block of the first nonvolatile memory zone; and
   writing the final flag.

2. The method of claim 1 comprising detecting an anomaly in a temporary information structure present in the second nonvolatile memory zone based on flags of the temporary information structure present in the second nonvolatile memory zone not having a same logic state, the logic state being a state of erased or written.

3. The method of claim 1 comprising:
   upon a detection of an anomaly in an erroneous temporary information structure present in the second nonvolatile memory zone:
   recopying the erroneous temporary information structure into the second nonvolatile memory zone; and
   neutralizing the erroneous temporary information structure by writing of erased metadata and overwriting of programmed metadata of the erroneous temporary information structure.

4. The method of claim 1 comprising:
   defining erasable pages in the first nonvolatile memory zone, a page comprising several blocks; and
   erasing a page of the first nonvolatile memory zone;
   in conjunction with the erasing of the page of the first nonvolatile memory zone, writing in the second nonvolatile memory zone a temporary information structure associated with the erasing of the page of the first nonvolatile memory zone, wherein the temporary information structure associated with the erasing of the page of the first nonvolatile memory zone comprises:
   a start flag associated with the erasing of the page of the first nonvolatile memory zone;
   an identifier of the temporary information structure associated with the erasing of the page of the first nonvolatile memory zone;
   an information about a location of the page of the first nonvolatile memory zone; and
   a final flag associated with the erasing of the page of the first nonvolatile memory zone.

5. The method of claim 4 wherein the erasing the page of the first nonvolatile memory zone comprises:
   writing a first part of the start flag associated with the erasing of the page;
   writing the identifier of the temporary information structure associated with the erasing of the page of the first nonvolatile memory zone and the information about the location of the of the page of the first nonvolatile memory zone;
   writing a second part of the start flag associated with the erasing of the page;
   erasing the page of the first nonvolatile memory zone; and
   writing the final flag associated with the erasing of the page.

6. The method of claim 1 comprising:
   defining a virtual memory comprising logical pages each having a logical address;
   defining, in the logical pages, logical blocks each having a logical address;
   defining write commands and read commands of data in the logical blocks;
   defining, in the first nonvolatile memory zone, erasable physical pages, each having a physical address;
   defining, in the erasable physical pages, programmable physical blocks of a same size as the logical blocks, each programmable physical block having a physical address; and
   defining, in the second nonvolatile memory zone, metadata structures associated with the physical blocks, the metadata structures associated with the physical blocks comprising information about a status of each physical block, the status of each physical block being from among the following statuses: block erased, block containing a valid data, or block containing an invalid data.

7. The method of claim 6 comprising:
configuring metadata structures that form descriptors, including configuring metadata structures that form a descriptor being associated with a physical page in the first nonvolatile memory zone, wherein the descriptor includes:
  a first field containing an address of the physical page in the first nonvolatile memory zone or a physical address index;
  a second field containing a logical address of a logical page in the virtual memory or logical address index; and
  for each physical block in the physical page in the first nonvolatile memory zone with which the descriptor is associated, a third field containing:
    an information about a location of the physical block in the physical page;
    an information about a status of the physical block, the status of the physical block in the physical page being from the at least three following statuses: block erased, block containing a valid data, or block containing an invalid data; and
    an information about a location, in the logical page in the virtual memory, of a logical block, data of which is stored in the physical block.

8. The method of claim 6, wherein the information included in the temporary information structure about the location of the block in the first nonvolatile memory zone includes information about a location in the second nonvolatile memory zone of a metadata structure associated with a block to program in the first nonvolatile memory zone.

9. The method of claim 1 comprising:
in response to a read command of other data including a logical address of the other data:
  finding in the second nonvolatile memory zone a descriptor containing the logical address of the other data and associated with valid data;
  reading in the descriptor containing the logical address of the other data an address of the other data in the first nonvolatile memory zone; and
  reading the other data in the first memory zone.

10. The method of claim 1 comprising:
detecting an anomaly in a temporary information structure; and
performing an action aiming to correct effects of a cause of the anomaly and to put the first nonvolatile memory zone or the second nonvolatile memory zone back into a state that the first nonvolatile memory zone or the second nonvolatile memory zone was in before the cause of the anomaly occurred.

11. The method of claim 1 comprising defining the first nonvolatile memory zone and the second nonvolatile memory zone within one nonvolatile memory.

12. A method for writing and reading data in electrically erasable and programmable nonvolatile memory cells comprising:
writing data in a block of a first nonvolatile memory zone that is programmable by block;
in conjunction with the writing the data in the block of the first nonvolatile memory zone, writing in a second nonvolatile memory zone containing metadata associated with data in the first nonvolatile memory zone, metadata associated with the writing of the data in the block, the metadata being written in a temporary information structure associated with the writing of the data in the block, wherein the temporary information structure associated with the writing of the data in the block includes:
  a start flag;
  an identifier of the temporary information structure;
  an information about a location of the block in the first nonvolatile memory zone; and
  a final flag;
erasing a metadata page of the second nonvolatile memory zone, the metadata page containing only invalid metadata;
in conjunction with the erasing of the metadata page, writing in the second nonvolatile memory zone, metadata associated with the erasing of the metadata page, the metadata associated with the erasing of the metadata page being written in a temporary information structure associated with the erasing of the metadata page, the temporary information structure associated with the erasing of the metadata page including:
  a start flag associated with the erasing of the metadata page;
  an identifier of the temporary information structure associated with the erasing of the metadata page;
  an information about a location of the metadata page in the second memory zone; and
  a final flag associated with the erasing of the metadata page; and
in conjunction with a power-on of the first nonvolatile memory zone, searching for an anomaly in temporary information structures present in the second nonvolatile memory zone.

13. The method of claim 12 comprising writing, in the temporary information structure associated with the erasing of the metadata page, a value of a wear counter associated with the metadata page, the wear counter representative of a number of erase cycles that the metadata page has undergone.

14. The method of claim 12 comprising detecting an anomaly in a temporary information structure present in the second nonvolatile memory zone based on flags of the temporary information structure present in the second nonvolatile memory zone not having a same logic state, the logic state being a state of erased or written.

15. The method of claim 12 comprising:
upon a detection of an anomaly in an erroneous temporary information structure present in the second nonvolatile memory zone:
  recopying the erroneous temporary information structure into the second nonvolatile memory zone; and
  neutralizing the erroneous temporary information structure by writing of erased metadata and overwriting of programmed metadata of the erroneous temporary information structure.

16. The method of claim 12, wherein the writing data in the block of the first nonvolatile memory zone comprises:
writing a first part of the start flag;
writing the identifier of the temporary information structure and the information about the location of the block in the first nonvolatile memory zone;
writing a second part of the start flag;
writing the data in the block of the first nonvolatile memory zone; and
writing the final flag.

17. An integrated circuit comprising:
a processing unit; and
at least one nonvolatile memory, communicatively coupled to the processing unit, comprising electrically erasable and programmable memory cells, wherein the processing unit is configured to receive write or read commands and to execute commands that cause the following to be performed:

writing data in a block of a first nonvolatile memory zone that is programmable by block;

in conjunction with the writing the data in the block of the first nonvolatile memory zone, writing in a second nonvolatile memory zone containing metadata associated with data in the first nonvolatile memory zone, metadata associated with the writing of the data in the block, the metadata being written in a temporary information structure associated with the writing of the data in the block, wherein the temporary information structure associated with the writing of the data in the block includes:

a start flag;

an identifier of the temporary information structure;

an information about a location of the block in the first nonvolatile memory zone; and a final flag; and in conjunction with a power-on of the first nonvolatile memory zone, searching for an anomaly in temporary information structures present in the second nonvolatile memory zone, wherein the writing the data in the block of the first nonvolatile memory zone comprises:

writing a first part of the start flag;

writing the identifier of the temporary information structure and the information about the location of the block in the first nonvolatile memory zone;

writing a second part of the start flag;

writing the data in the block of the first nonvolatile memory zone; and writing the final flag.

18. The integrated circuit of claim 17, wherein the processing unit is further configured to execute commands that cause detecting of an anomaly in a temporary information structure present in the second nonvolatile memory zone based on flags of the temporary information structure present in the second nonvolatile memory zone not having a same logic state, the logic state being a state of erased or written.

19. The integrated circuit of claim 17, wherein the processing unit is further configured to execute commands that cause the following to be performed:

upon a detection of an anomaly in an erroneous temporary information structure present in the second nonvolatile memory zone:

recopying the erroneous temporary information structure into the second nonvolatile memory zone; and neutralizing the erroneous temporary information structure by writing of erased metadata and overwriting of programmed metadata of the erroneous temporary information structure.

20. The integrated circuit of claim 17, wherein the processing unit is further configured to execute commands that cause the following to be performed:

in response to a read command of other data including a logical address of the other data:

finding in the second nonvolatile memory zone a descriptor containing the logical address of the other data and associated with valid data;

reading in the descriptor containing the logical address of the other data an address of the other data in the first nonvolatile memory zone; and reading the other data in the first memory zone.

21. A portable device comprising:

a portable device housing; and an integrated circuit within the housing, the integrated circuit comprising:

a processing unit; and at least one nonvolatile memory, communicatively coupled to the processing unit, comprising electrically erasable and programmable memory cells, wherein the processing unit is configured to receive write or read commands and to execute commands that cause the following to be performed:

writing data in a block of a first nonvolatile memory zone that is programmable by block;

in conjunction with the writing the data in the block of the first nonvolatile memory zone, writing in a second nonvolatile memory zone containing metadata associated with data in the first nonvolatile memory zone, metadata associated with the writing of the data in the block, the metadata being written in a temporary information structure associated with the writing of the data in the block, wherein the temporary information structure associated with the writing of the data in the block includes:

a start flag;

an identifier of the temporary information structure;

an information about a location of the block in the first nonvolatile memory zone; and a final flag; and in conjunction with a power-on of the first nonvolatile memory zone, searching for an anomaly in temporary information structures present in the second nonvolatile memory zone, wherein the writing the data in the block of the first nonvolatile memory zone comprises:

writing a first part of the start flag;

writing the identifier of the temporary information structure and the information about the location of the block in the first nonvolatile memory zone;

writing a second part of the start flag;

writing the data in the block of the first nonvolatile memory zone; and writing the final flag.

22. The portable device claim 21, wherein the processing unit is further configured to execute commands that cause detecting of an anomaly in a temporary information structure present in the second nonvolatile memory zone based on flags of the temporary information structure present in the second nonvolatile memory zone not having a same logic state, the logic state being a state of erased or written.

23. The portable device of claim 21, wherein the processing unit is further configured to execute commands that cause the following to be performed:

upon a detection of an anomaly in an erroneous temporary information structure present in the second nonvolatile memory zone:

recopying the erroneous temporary information structure into the second nonvolatile memory zone; and neutralizing the erroneous temporary information structure by writing of erased metadata and overwriting of programmed metadata of the erroneous temporary information structure.

24. The portable device of claim 21, wherein the processing unit is further configured to execute commands that cause the following to be performed:

in response to a read command of other data including a logical address of the other data:

finding in the second nonvolatile memory zone a descriptor containing the logical address of the other data and associated with valid data;
reading in the descriptor containing the logical address of the other data an address of the other data in the first nonvolatile memory zone; and
reading the other data in the first memory zone.

* * * * *